United States Patent [19]

Kishida

[11] Patent Number: 5,731,854
[45] Date of Patent: Mar. 24, 1998

[54] METHOD OF EFFECTIVELY DISPERSING STATIC ELECTRICITY IN LCD PRODUCTION BY PLACING A SHORT LINE IN THE END REGION OF ONE SUBSTRATE WHICH EXTENDS BEYOND THE OTHER SUBSTRATE

[75] Inventor: Masahiro Kishida, Nabara, Japan

[73] Assignee: Sharp Kabushiki Kaisha, Osaka, Japan

[21] Appl. No.: 643,384

[22] Filed: May 6, 1996

[30] Foreign Application Priority Data

May 15, 1995 [JP] Japan ................... 7-116071

[51] Int. Cl.⁶ ............... G02F 1/1333; G02F 1/136; G02F 1/1345; G02F 1/13
[52] U.S. Cl. ............... 349/40; 349/41; 349/149; 349/187
[58] Field of Search .............. 349/40, 41, 42, 349/49, 149, 187

[56] References Cited

U.S. PATENT DOCUMENTS

| 4,787,712 | 11/1988 | Ukai et al. | 349/38 |
| 5,327,267 | 7/1994 | Aoki et al. | 349/40 |

FOREIGN PATENT DOCUMENTS

| 63-208023 | 8/1988 | Japan . | |
| 4-221926 | 8/1992 | Japan | 349/149 |
| 6-148666 | 5/1994 | Japan . | |
| 6-289432 | 10/1994 | Japan . | |

*Primary Examiner*—William L. Sikes
*Assistant Examiner*—Walter Malinowski
*Attorney, Agent, or Firm*—Nixon & Vanderhye P.C.

[57] ABSTRACT

A producing method of a liquid crystal display comprising a first glass substrate having a plurality of pixel electrodes, signal lines, and MIM elements, and a second glass substrate having a plurality of opposing electrodes connected to scanning lines while opposing the pixel electrodes individually. The output terminal unit of a first driver IC is connected to the input terminal unit of the signal lines and the output terminal unit of a second driver IC is connected to the input terminal unit of the scanning lines. The electric short-circuit units made throughout the scanning lines and the signal lines are disconnected by irradiation of a laser beam. Making the short-circuit units throughout the signal lines and throughout the scanning lines makes it possible to disperse the static electricity generated during the fabrication within the liquid crystal display. As a result, high-quality liquid crystal displays are produced at enhanced yield.

12 Claims, 18 Drawing Sheets

METHOD OF EFFECTIVELY DISPERSING STATIC ELECTRICITY IN LCD PRODUCTION BY PLACING A SHORT LINE IN THE END REGION OF ONE SUBSTRATE WHICH EXTENDS BEYOND THE OTHER SUBSTRATE

FIELD OF THE INVENTION

The present invention relates to a method of producing active-matrix and non-active-dot-matrix liquid crystal displays.

BACKGROUND OF THE INVENTION

As is seen in the enhancing popularity of high-definition TVs, the screens for TV sets or monitors have been steadily upsized in recent years. Most of the 40-in. -screen displays employ CRT's (Cathode Ray Tubes) and some employ liquid crystal projectors. However, the displays using the CRT's or projectors increase the thickness (depth) and occupy more space in proportion to the screen size. Therefore, there has been an increasing need for thinner flat panel displays, and in particular, liquid crystal displays that consume less power and readily display a full-color image have been attracting attention.

The liquid crystal displays are distinguished into two types whether they use active elements or not: an active matrix liquid crystal display and a non-active-dot-matrix liquid crystal display.

Typical active elements are non-linear resistance elements including 2-terminal non-linear resistance elements generally known as MIM (Metal-Insulator-Metal) elements and 3-terminal non-linear resistance elements known as TFT (Thin-Film-Transistor) elements. In the former, a thin insulator film is sandwiched by metal thin film electrodes, while in the latter, a thin insulator film is covered with a semiconductor thin film.

An insulator film of the non-linear resistance element is, for example, as thin as 60 nm thick in case of the MIM element disclosed in Japanese Examined Patent Publication No. 61-32673 (1986), and therefore renders poor resistance to static electricity. Thus, dielectric breakdown readily occurs as the static electricity is generated during the MIM element fabrication, which causes two electrodes sandwiching the insulator film to short-circuit. Such a short-circuit disables the resulting MIM elements to serve as the active elements. The dielectric breakdown caused by the static electricity is most likely to occur during the alignment treatment.

Japanese Laid-Open Patent Application No. 63-208023 (1988) discloses a method of solving the above problem. In the cited reference, the electrode lines of the non-linear resistor elements are electrically short-circuited, and disconnected after the alignment treatment. To be more specific, the short-circuit unit is made on the outer frame of a glass substrate having the non-linear resistor elements, and removed by rubbing after the alignment treatment and the following liquid crystal injection.

However, rubbing the glass substrate generates additional static electricity, and causes more frequent dielectric breakdown in the non-linear resistor element. In addition, rubbing the glass substrate causes electrostatic nonuniformity over the alignment film on the glass substrate, thereby impairing display quality.

After the liquid crystals are injected, the input terminal unit of the electrode lines and the output terminal unit of the driver IC are electrically connected to each other with a connecting material, such as an anisotropic conducting film. However, static electricity is also generated when the connecting material is fixed for temporary holding. Thus, there still occurs dielectric breakdown in the non-linear resistor element, which causes defective pixels or electrostatic nonuniformity over the alignment film. Moreover, the static electricity damages or impairs the performance of the driver IC's and the driving circuit thereof.

To solve the above problem, Japanese Laid-open Patent Application No. 6-289432 discloses a method of preventing static electricity in the non-linear resistor elements, in particular, in the MIM elements. To be more specific, signal lines serving as the electrode lines are electrically connected to the driver IC, and the short-circuit units made throughout the signal lines are disconnected later.

As is illustrated in FIG. 19 showing a magnified view of a portion indicated by a capital letter D in FIG. 18, the liquid crystal display of the above cited reference includes a sealing area 53. The sealing area 53 is a portion where two glass substrates 51 and 52 shown in FIG. 18 are bonded to each other with a sealing material, and the liquid crystals are filled in the space therebetween. Although it is not illustrated in the drawing, the MIM elements formed on the glass substrate 51 are connected to both the pixel electrodes and the signal lines 54 serving as the electrode lines. A common electrode 55, which electrically interconnects the signal lines 54, is formed within the sealing area 53 on the glass substrate 52.

The signal lines 54 and common electrode 55 are electrically separated by disconnecting the connection therebetween. In practice, after driver IC's 58 are connected to external connecting terminal units of the signal lines 54, a pulse of Nd-YAG (Yttrium Aluminum Garnet) laser beam is irradiated on the connecting portion toward the inside of the glass substrate 52.

In short, the signal lines 54 and driver IC's 58 are electrically connected, and the short-circuit units made throughout the signal lines 54 are disconnected later in the cited reference. This method makes it possible to prevent not only the static electricity generated after the liquid crystals are injected, but also the static electricity generated when the signal lines 54 and driver IC's 58 are connected to each other electrically.

Thus, the above method prevents the dielectric breakdown in the MIM elements and the electrostatic nonuniformity over the alignment film on the glass substrate 51, as well as the damages to or performance degradation of the driver IC's 58 and the driving circuits thereof.

Note that, however, the above method is only aimed at releasing the static electricity generated in the glass substrate 51 side, and remains silent about the release of the static electricity in the other glass substrate 52 side.

As is in the glass substrate 51, the static electricity is generated in the glass substrate 52 side during the fabrication including the steps of the alignment treatment, injecting the liquid crystals, and connecting the scanning lines to the driver IC's 59 with a conducting film. However, in the above method, the static electricity thus generated is not dispersed within the liquid crystal display in a satisfactory manner. Therefore, the static electricity in the glass substrate 52 side causes the dielectric breakdown in the MIM elements and electrostatic nonuniformity over the alignment film on the glass substrate 52, as well as the damages to or performance degradation of the driver IC's 59 and the driving circuits thereof.

SUMMARY OF THE INVENTION

It is therefore an object of the present invention to provide a method of producing a liquid crystal display effectively dispersing static electricity generated therein and increasing the yield dramatically.

To fulfill the above object, a method of producing a liquid crystal display including (a) a first substrate having a matrix of pixel electrodes, signal lines for supplying charges to each pixel electrode, and 2-terminal non-linear resistor elements for switching current conductance between said pixel electrodes and said signal lines, (b) a second substrate having scanning lines opposing said pixel electrodes, and (c) liquid crystals filled in a sealing section between said first and second substrates is characterized by comprising the steps of:

- making electric short-circuit units throughout said signal lines and throughout said scanning lines, respectively;
- connecting a first driving circuit and a second driving circuit to said signal lines and said scanning lines, respectively; and
- disconnecting said short-circuit units by irradiation of a light beam.

According to the above method, the short-circuit units are made throughout the signal lines on the first substrate and throughout the scanning lines on the second substrate, respectively. Then, the signal lines and scanning lines are connected to the first and second driving circuits, respectively, and the short-circuit units are disconnected later by irradiation of a light beam. As a result, the static electricity generated in the producing steps including the alignment treatment and liquid crystal injection is dispersed within the liquid crystal display.

Moreover, the short-circuit units are made on each substrate. Thus, besides the static electricity generated on the first substrate, the static electricity generated on the second substrate when connecting the scanning lines to the second driving circuit, which is not dispersed conventionally, can be dispersed within the liquid crystal display.

Accordingly, it has become possible to eliminate defective pixels due to the dielectric breakdown in the 2-terminal non-linear resistor element, thereby enhancing the yield of the liquid crystal display dramatically. In addition, since the static electricity is dispersed within the liquid crystal display, the electrostatic nonuniformity over the alignment film on the glass substrate, as well as the damages to or performance degradation of the first and second driving circuits can be eliminated.

Also, to fulfill the above object, a method of producing the above-structure liquid crystal display in accordance with the present invention is characterized by comprising the steps of:

- extending said signal lines beyond said sealing section toward an end opposing a first connecting portion where said signal lines are to be connected to a first driving circuit, and making a first short-circuit unit throughout said extended signal lines on said first substrate;
- extending said scanning lines beyond said sealing section toward an end opposing a second connecting portion where said scanning lines are to be connected to a second driving circuit, and making a second short-circuit unit throughout said extended scanning lines on said second substrate;
- connecting said signal lines and said scanning lines to said first driving circuit and said second driving circuit, respectively; and
- disconnecting said first and second short-circuit units by irradiation of a light beam.

According to the above method, the first and second short-circuit units are spaced apart from the first and second driving circuits, respectively. Thus, heat of the irradiated light beam is hardly transferred from the short-circuit units to their respective driving circuits, thereby making it possible to prevent the damages to the first and second driving circuits due to the heat of the light beam. Further, since the first and second short-circuit units are made beyond the sealing section, the first and second short-circuit units can be made independently of the size of the first and second substrates. Accordingly, the first and second short-circuit units can be made more easily.

Also, to fulfill the above object, a method of producing the above-structure liquid crystal display in accordance with the present invention is characterized by comprising the steps of:

- extending said signal lines on said first substrate over an end portion opposing a first connecting portion where said signal lines are to be connected to a first driving circuit, said end portion being longer than a corresponding end portion of said second substrate;
- extending said scanning lines on said second substrate over an end portion opposing a second connecting portion where said scanning lines are to be connected to a second driving circuit, said end portion being longer than a corresponding end portion of said first substrate;
- making short-circuit units throughout said signal lines and throughout said scanning lines on said end portions of said first and second substrate, respectively;
- connecting said signal lines and said scanning lines to said first driving circuit and said second driving circuit, respectively; and
- disconnecting said first and second short-circuit units by irradiation of a light beam.

According to the above method, the first and second short-circuit units are spaced apart from the first and second driving circuits, respectively. Thus, heat of the irradiated light beam is hardly transferred from the short-circuit units to their respective driving circuits, thereby making it possible to prevent the damages to the first and second driving circuits due to the heat of the light beam. Also, since the end portions having the short-circuit units thereon is longer than the other substrate, the panel can be checked using the signal lines and scanning lines extended over their respective end portions.

Besides the above-structured liquid crystal display, the methods of producing a liquid crystal display of the present invention can be applied to a liquid crystal display including (a) a first substrate having a matrix of pixel electrodes, signal lines and scanning lines for supplying charges to each pixel electrode, and 3-terminal non-linear resistor elements for switching current conductance through said pixel electrodes, said signal lines, and said scanning lines, (b) a second substrate having opposing electrodes opposing said pixel electrodes individually, and (c) liquid crystals filled in a sealing section between said first and second substrates. In this case, the function and effect remain the same.

Further, the signal and scanning lines are formed on the single substrate. Thus, the steps of making the short-circuit units and disconnecting the same are carried out only once using one substrate, thereby simplifying the producing steps compared with the case using the 2-terminal non-linear resistor element.

Moreover, besides the above-structured liquid crystal displays, the methods of producing a liquid crystal display of the present invention can be applied to a liquid crystal display including a first substrate having signal lines, a second substrate having scanning lines opposing said signal lines, and liquid crystals sealed in a sealing section between said first and second substrates, and the function and effect remain the same.

For a fuller understanding of the nature and advantages of the invention, reference should be made to the ensuing detailed description taken in conjunction with the accompanying drawings.

DESCRIPTION OF THE EMBODIMENTS (First Embodiment)

Referring to FIGS. 1 through 5, the following description will describe a first embodiment of the present invention.

Figure 2:
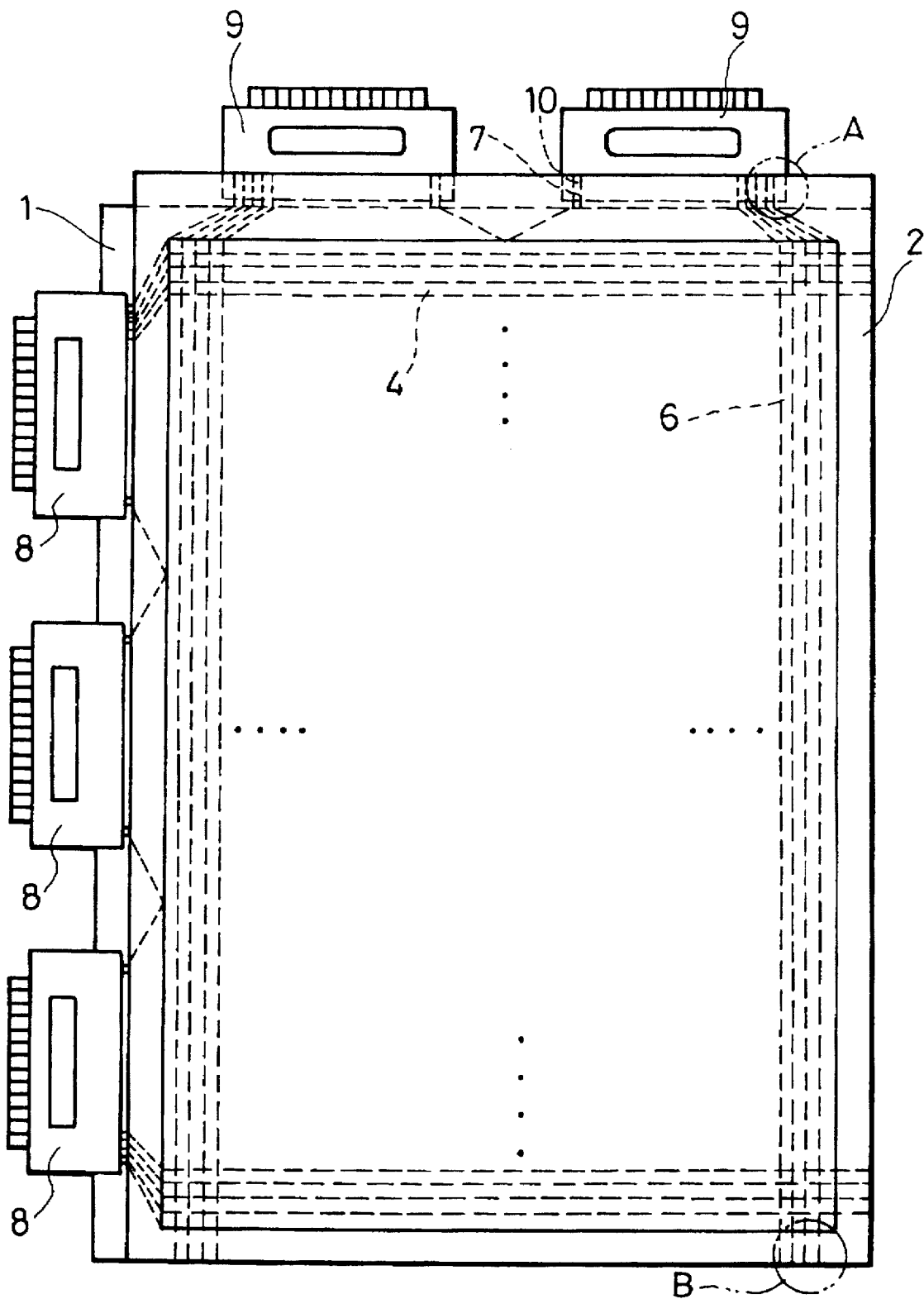
FIG. 2 is a plan view showing a schematic structure of the above liquid crystal display.

As shown in FIG. 2, a liquid crystal display in accordance with the present embodiment includes a glass substrate 1 (first substrate) and another glass substrate 2 (second substrate) bonded to each other with an unillustrated sealing material, and although it is not shown in the drawing, the liquid crystals are filled in a space between the two glass substrates. Signal lines 4 are formed on the glass substrate 1 while scanning lines 6 are formed on the other glass substrate 2 in such a manner to oppose the signal lines 4. The liquid crystal display is driven by driver IC's 8 (first driving circuits) and driver IC's 9 (second, driving circuits). Unillustrated output terminal units of the driver IC's 8 are connected to the side of unillustrated input terminal units of the signal lines 4, while output terminal units 10 of the driver IC's 9 are connected to the side of input terminal units 7 of the scanning lines 6. Note that the above output terminal units are made of a base film (polyimide film).

Figure 3:
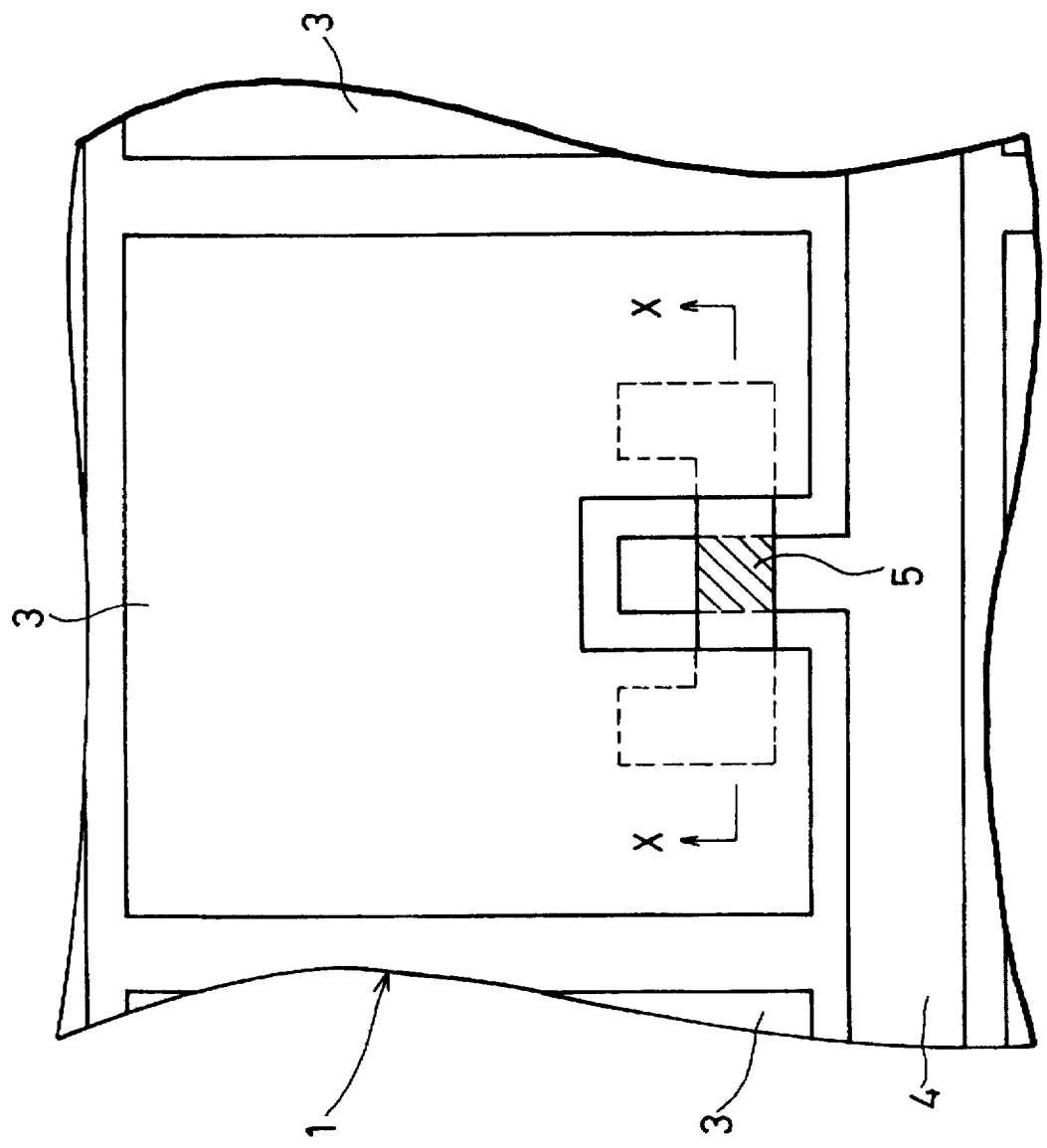
FIG. 3 is a plan view showing a pixel structure of the above liquid crystal display.

As shown in FIG. 3, a matrix of pixel electrodes 3 are placed on the glass substrate 1 and MIM elements 5 are placed on the same in the matching numbers to electrically connect each pixel electrode 3 to the signal line 4.

Figure 4:
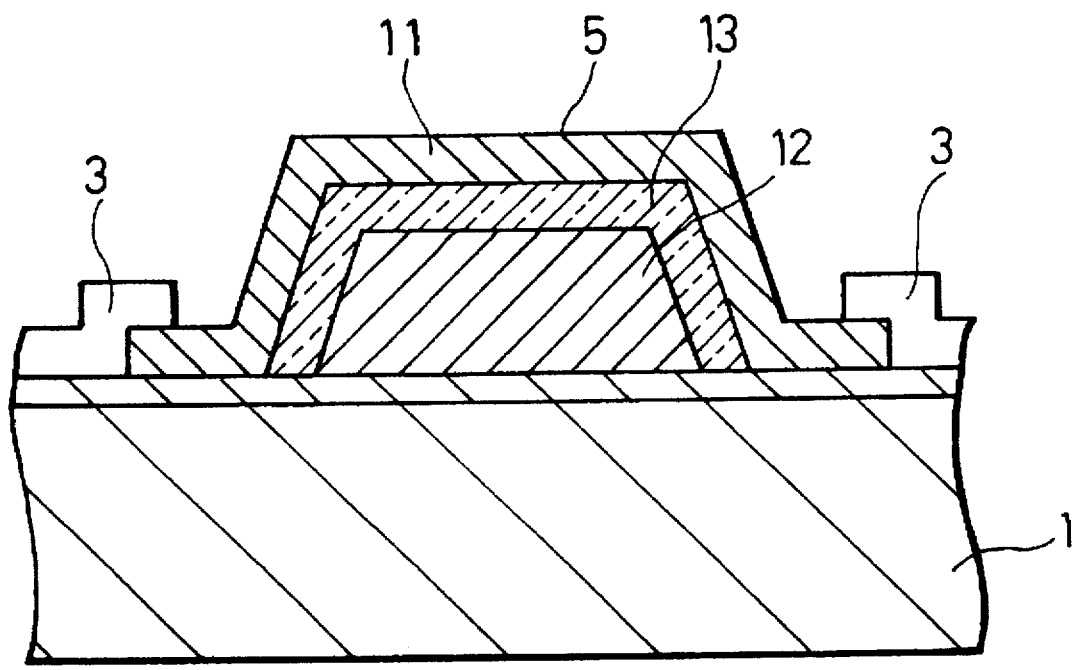
FIG. 4 is a perspective cross-sectional view taken on line X—X of FIG. 3.

Next, the MIM elements 5 will be described below with reference to FIG. 4 showing a perspective cross-sectional view taken on line X—X of FIG. 3.

Each MIM element 5 includes an upper electrode 11 and a lower electrode 12 both made of a metal thin film, and an insulator film 13 sandwiched by the two electrodes. The upper electrode 11 is made of titanium, while the lower electrode 12, which forms an integral part of the signal lines 4, is made of tantalum. The insulator film 13 is a 60 nm-thick film made by anodizing the lower electrode 12. The upper electrode 11 is connected to the pixel electrodes 3 made of ITO (Indium Tin Oxide).

Figure 1:
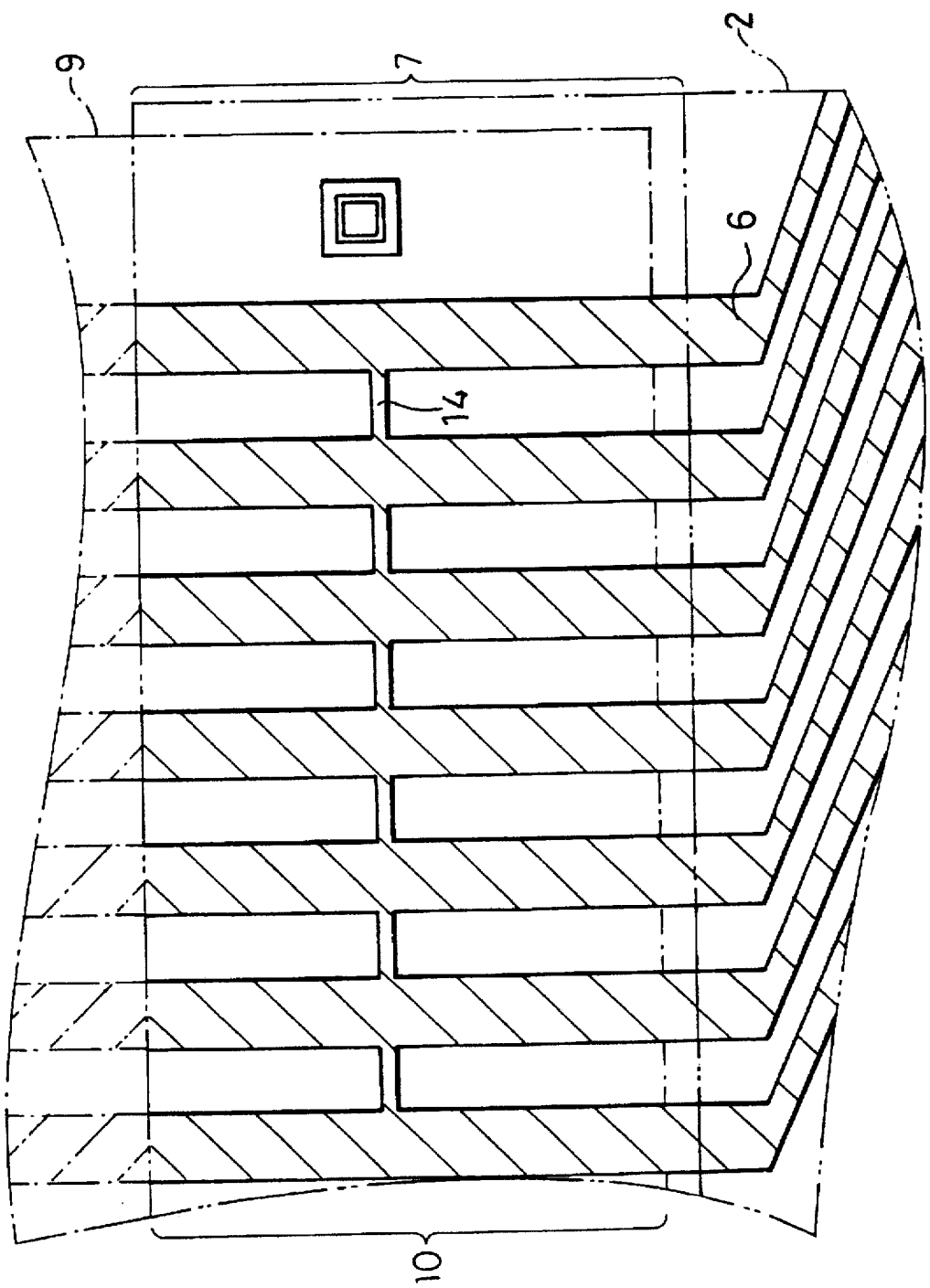
FIG. 1 is a plan view depicting short-circuit units made at a connecting portion of scanning lines and driver IC's on a glass substrate of a liquid crystal display in accordance with an example embodiment of the present invention.

Further, as illustrated in FIG. 1 showing a magnified view of a portion indicated by a capital letter A in FIG. 2, the scanning lines 6 are formed on the glass substrate 2. Although it is not shown in the drawing, opposing electrodes, which are provided in such a manner to oppose the pixel electrodes 3 individually, are connected to the scanning lines 6 on the glass substrate 2. In addition, a short-circuit unit 14 is formed between every two adjacent scanning lines 6 to prevent dielectric breakdown in the MIM element 5 caused by the static electricity.

The short-circuit units 14 are formed on the surfaces of the input terminal units 7 where the output terminal units 10 of the driver IC's 9 touch. The short-circuit units 14 extend across the scanning lines 6, so that each connects every two adjacent scanning lines 6 in the shortest distance, in other words, the short-circuit units 14 are orthogonal to the scanning lines 6.

Further, unillustrated short-circuit units are formed on the input terminal units of the signal lines 4 in the same manner as above. Then, the input terminal units are connected to the output terminal units of the driver IC's 8.

Figure 5:
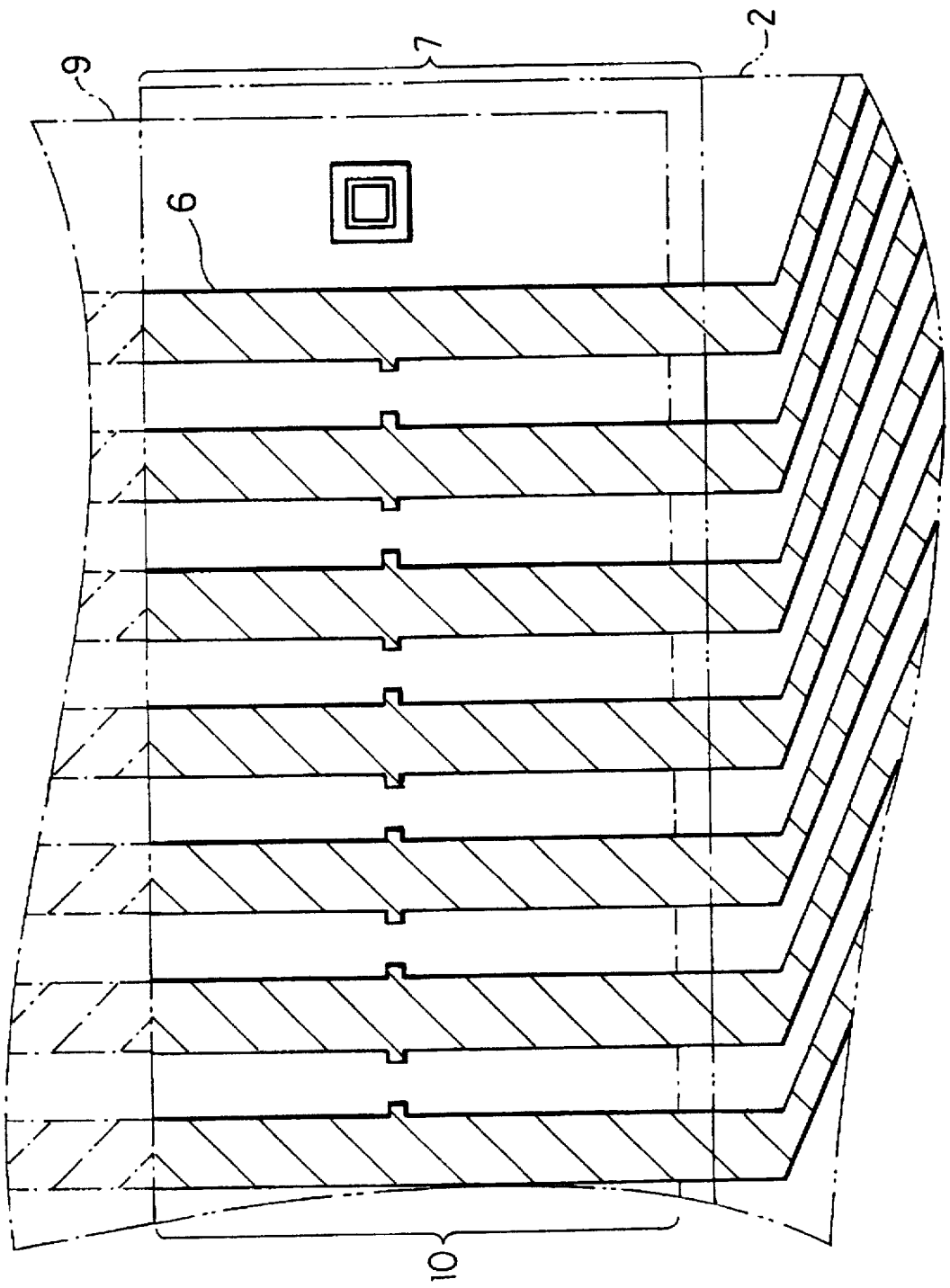
FIG. 5 is a plan view showing the above short-circuit units when disconnected.

The short-circuit units 14 are not disconnected until the input terminal units 7 and output terminal units 10 are connected to each other with an anisotropic conducting film or the like after the alignment treatment and liquid crystal injection. The short-circuit units 14 are, for example, 300 μm wide. The short-circuit units 14 are disconnected when irradiated by a laser beam from the glass substrate 2 side in a direction perpendicular to the longitudinal direction of the scanning lines 6 across the same. FIG. 5 shows the disconnected short-circuit units 14.

Likewise, the short-circuit units formed across the signal lines 4 are disconnected by irradiation of a laser beam from the glass substrate 1 side in a direction perpendicular to the longitudinal direction of the signal lines 4 across the same.

The laser beam used herein is a beam of a laser diode excited laser (Nd-YAG laser) converged by a light converging system. The laser beams has a wavelength of 1064 nm, a cycle frequency of 1.2 kHz, and a laser spot size of 20 µm. The laser beam scans the short-circuit units 14 with a stripe pitch of 92 µm and cuts out the short-circuit units 14 with a trace width of 45 µm using a galvanometer.

In the present embodiment, the short-circuit units made throughout the scanning lines 6 and throughout the signal lines 4 are disconnected after the scanning lines 6 and signal lines 4 are connected to the driver IC's 9 and 8, respectively. Thus, the static electricity generated before the short-circuit units disconnecting step are dispersed within the liquid crystal display.

This eliminates the dielectric breakdown in the MIM element 5 and electrostatic nonuniformity over the alignment films on the glass substrates 1 and 2, as well as the damages to or performance degradation of the driver IC's 8 and 9 and the driving circuits thereof. As a result, the liquid crystal displays can be produced at enhanced yield.

For instance, the possibility of any failure of the insulating film 13 in the MIM element 5 within the effective display area per panel during the fabrication shows a remarkable fall from 90% to 1% or less.

The static electricity is readily generated when the driver IC's 9 are connected to the scanning lines 6 (first connecting portion), and the driver IC's 8 to the signal lines 4 (second connecting portion). However, the short-circuit units are made in each connecting portion, so that the static electricity is dispersed at a portion where it was generated, namely, the connecting portions, thereby minimizing the adverse effects of the static electricity on pixels.

In the present embodiment, the short-circuit units are made between every two adjacent scanning lines 6 and between every two adjacent signal lines 4 at an arbitrary point along the signal lines 4 and scanning lines 6 other than the two ends, respectively. This structure makes it possible to determine the width of the short-circuit units arbitrary. Thus, for example, if the short-circuit units are made narrower than the scanning lines 6 and signal lines 4, the short-circuit units are disconnected faster compared with a conventional method which disconnects the common electrode lines interconnecting the scanning and signal lines at their respective open-ends.

Also, note that the short-circuit units can be as small as the least effective area for conducting current. Thus, the laser beam is irradiated to a minimum area and the short-circuit units are disconnected faster.

Further, the driver IC's are connected to the signal lines 4 or scanning lines 6 at both ends (the driver IC's are connected to the panel at both ends) in some cases depending on the panel driving methods; however, the short-circuit units can be made in the same manner as above regardless of the panel structure.

(Second Embodiment)

Figure 6:
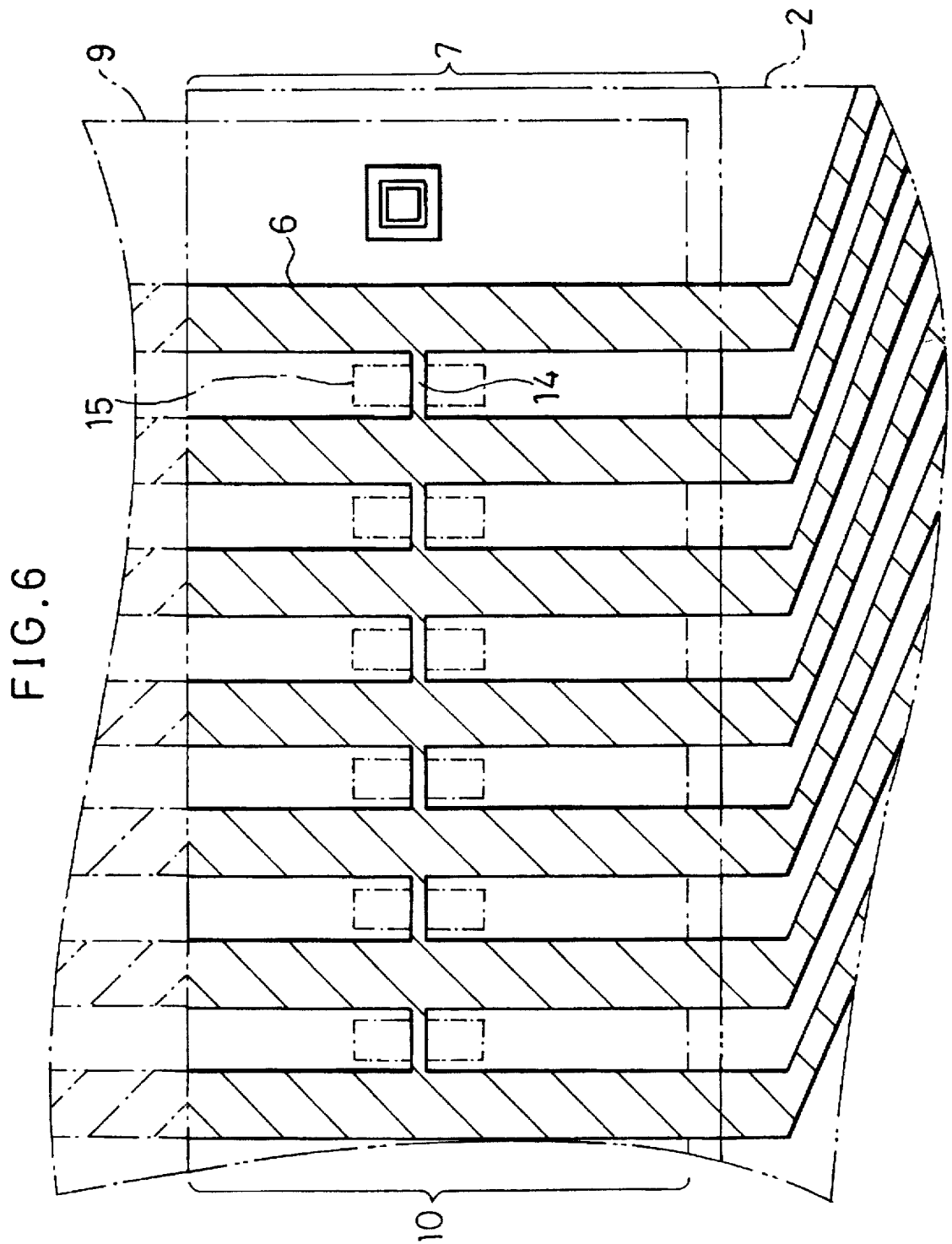
FIG. 6 is a plan view depicting short-circuit units of a liquid crystal display in accordance with another example embodiment of the present invention.

Referring to FIG. 6, the following description will describe a second embodiment of the present invention. Hereinafter, like components are labeled with like reference numerals with respect to the first embodiment, and the description of these components is not repeated for the explanation's convenience.

As shown in FIG. 6, a liquid crystal display in accordance with the present embodiment additionally includes through holes 15 in the output terminal units 10 of the driver IC's 9 in such a manner to cross the short-circuit units 14 made between every two adjacent scanning lines 6, respectively. Note that the shape of the through holes 15 is not especially limited, provided that they cross the short-circuit units 14 without fail.

Like the first embodiment, each output terminal unit 10 is made of a base film (polyimide film). However, if the laser beam used in the first embodiment is irradiated to the short-circuit units 14, heat such that may break the driver IC's 9 is transferred from the short-circuit units 14 through the base film.

This is the reason why the through holes 15 are made in the output terminal units 10 herein. To be more specific, after disconnecting the short-circuit units 14, the laser beam passes through the through holes 15. This inhibits heat transfer from the short-circuit units 14 to the driver IC's 9 and hence prevents the damage to the same. Although it is not illustrated in the drawing, similar through holes are made in the output terminal units of the driver IC's 8, and the laser beam is irradiated along the through holes. Thus, no laser beam is irradiated to the base film of the output terminal unit of the driver IC's 8. This inhibits heat transfer from the short-circuit units to the driver IC's 8 and hence prevents the damage to the same as well.

(Third Embodiment)

Figure 7:
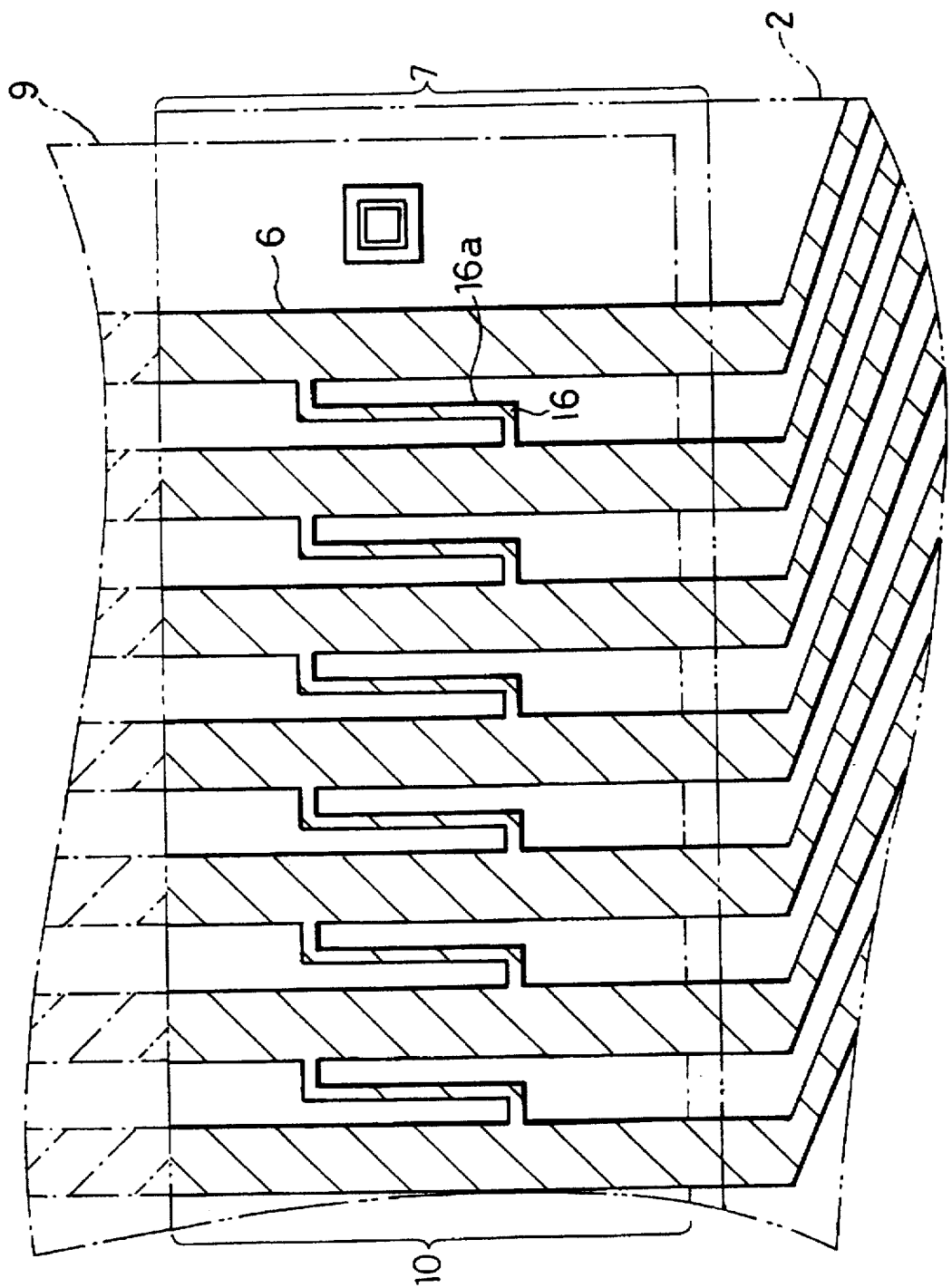
FIG. 7 is a plan view depicting short-circuit units of a liquid crystal display in accordance with a further example embodiment of the present invention.
Figure 8:
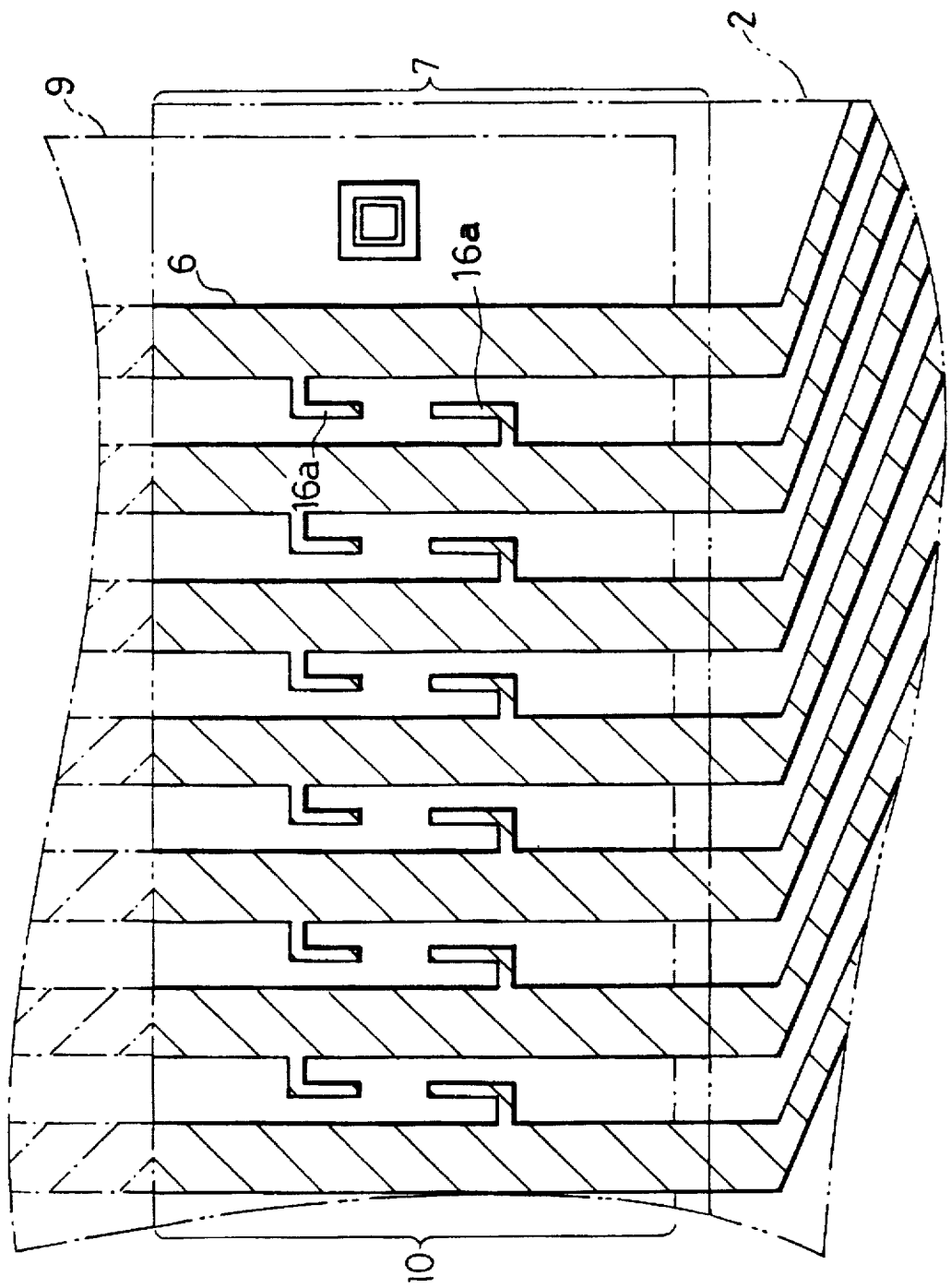
FIG. 8 is a plan view showing the above short-circuit units when disconnected.

Referring to FIGS. 7 and 8, the following description will describe a third example embodiment of the present invention. Hereinafter, like components are labeled with like reference numerals with respect to the first embodiment, and the description of these components is not repeated for the explanation's convenience.

As shown in FIG. 7, a liquid crystal display in accordance with the present embodiment includes short-circuit units 16 instead of the short-circuit units 14. Each short-circuit unit 16 includes two wires each extending across from two adjacent scanning lines 6 at a different point, and these two extending wires are connected by a longitudinal wire 16a extending along the scanning lines 6. The short-circuit units 16 are disconnected when a laser beam, having the same properties as the one used in the first embodiment, is irradiated to the longitudinal wires 16a across the scanning lines 6. FIG. 8 illustrates the disconnected short-circuit units 16.

This method makes it possible to determine the length of the longitudinal wire 16a regardless of the interval between the scanning lines 6, meaning that the irradiation point of the laser beam can be set less accurately compared with the first and second embodiments.

Forming similar short-circuit units between every two adjacent signal lines 4 also makes it possible to set the irradiation point of the laser beam less accurately.

Like the second embodiment, the through holes may be additionally formed in the output terminal units 10 of the driver IC's 9 and the output terminal units of the driver IC's 8 where the short-circuit units are made respectively throughout the scanning lines 6 and the signal lines 4, so that heat of the laser beam such that breaks the driver IC's 8 and IC's 9 is not transferred to the same.

(Fourth Embodiment)

Figure 9:
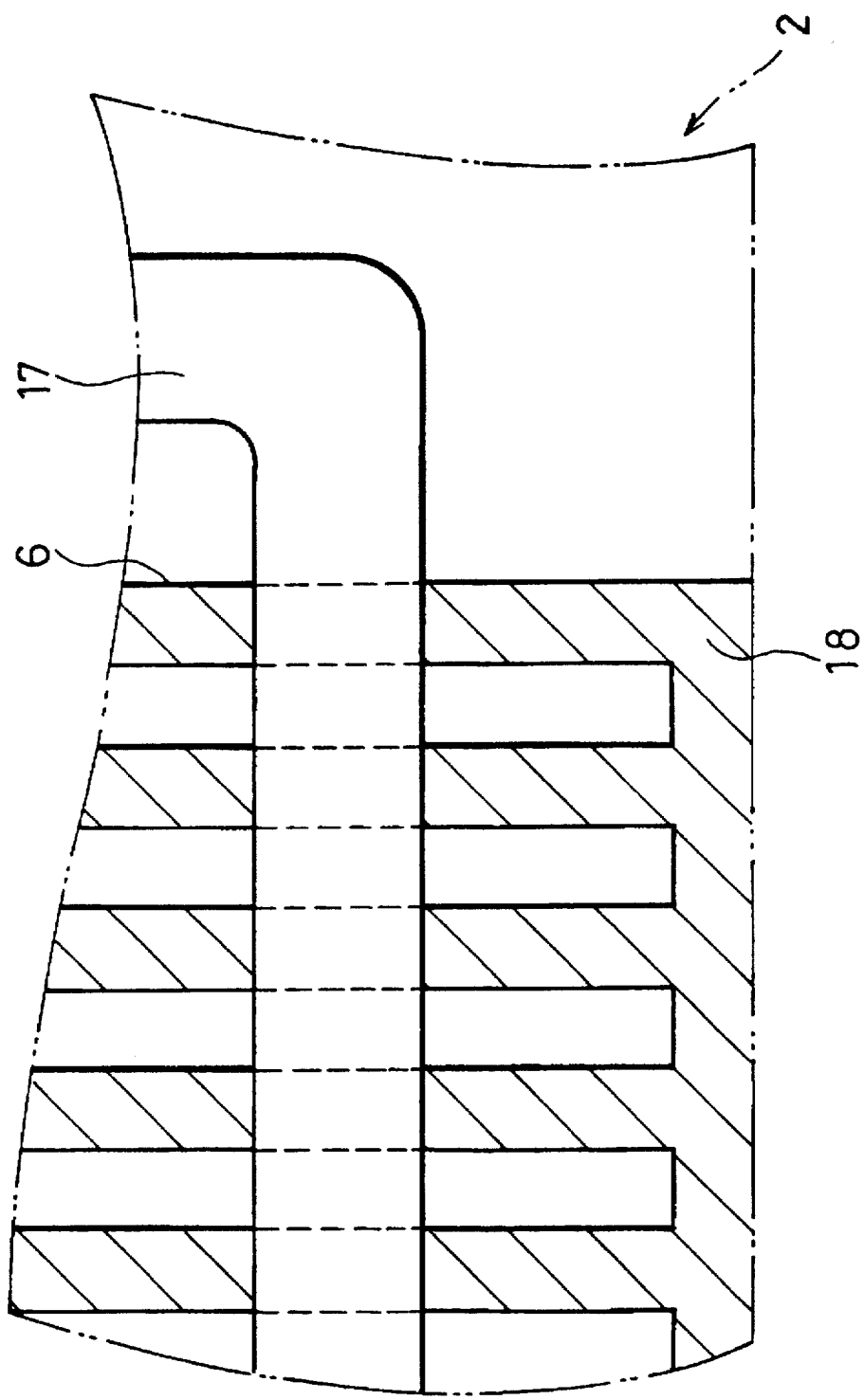
FIG. 9 is a plan view depicting a short-circuit unit of a liquid crystal display in accordance with still another example embodiment of the present invention.
Figure 10:
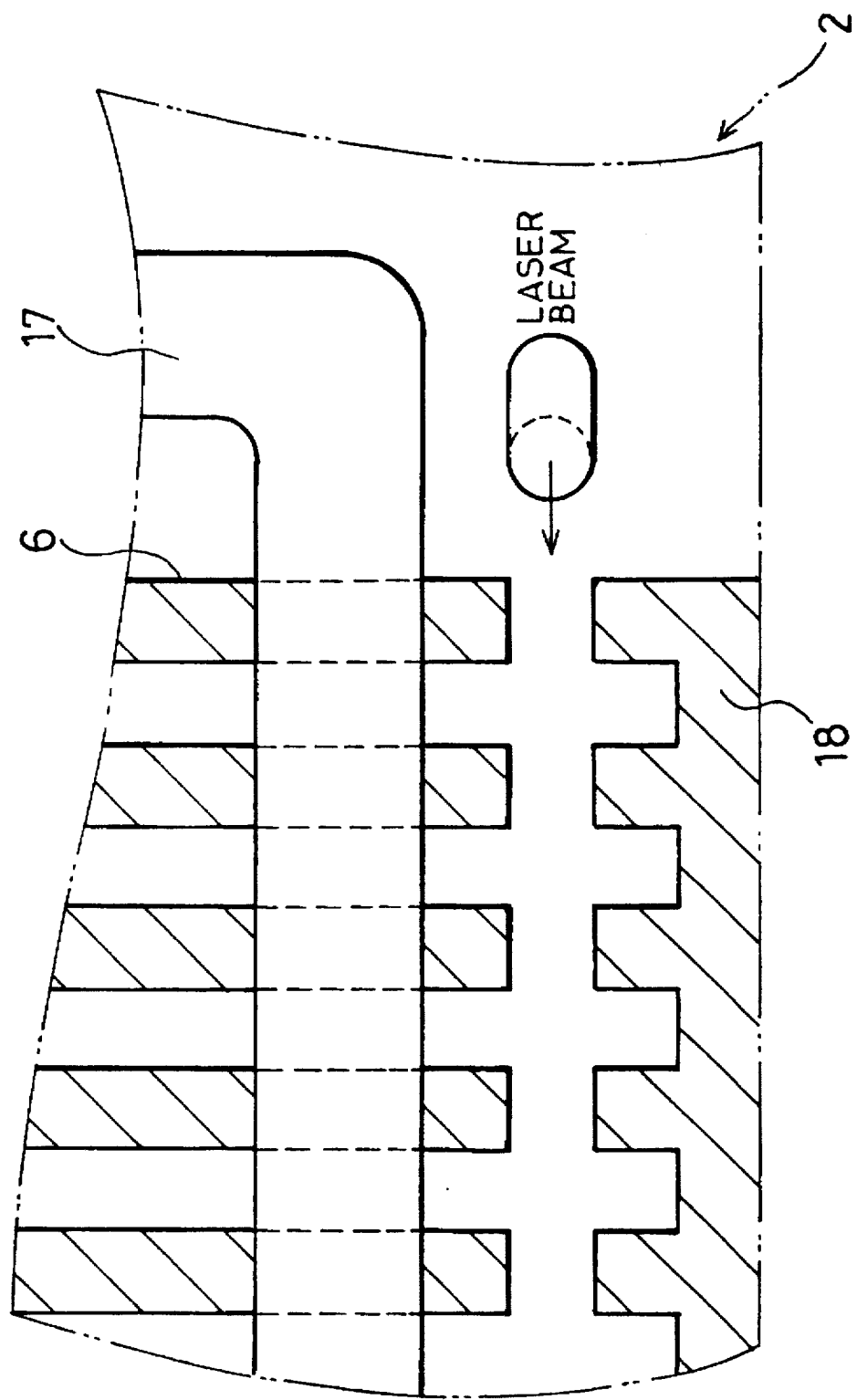
FIG. 10 is a plan view showing the above short-circuit unit when disconnected.

Referring to FIGS. 2, 9, and 10, the following description will describe a fourth example embodiment of the present invention. Hereinafter, like components are labeled with like reference numerals with respect to the first embodiment, and the description of these components is not repeated for the explanation's convenience.

As illustrated in FIG. 9 showing a magnified view of a portion indicated by a capital letter B in FIG. 2, a liquid crystal display in accordance with the present embodiment includes, instead of the short-circuit units 14, a short-circuit unit 18 beyond a sealing section 17 at the other end of the glass substrate 2 opposing the input terminal units of the scanning lines 6.

To be more specific, the scanning lines 6 are extended up to the edge of the glass substrate 2, or beyond the sealing section 17 formed at the other end of the glass substrate 2 opposing the input terminal units 7, and the short-circuit unit 18 is made throughout the scanning lines 6 beyond the sealing section 17.

Then, the input terminal units 7 of the scanning lines 6 and the output terminal units 10 of the driver IC's 9 are connected in the same manner as the first embodiment, and the laser beam is irradiated from the glass substrate 2 side to the short-circuit unit 18 formed beyond the sealing section 17 to disconnect the same. FIG. 10 illustrates the disconnected short-circuit unit 18.

Although it is not shown in the drawing, a short-circuit unit is made beyond the sealing section formed at the other end of the glass substrate 1 opposing the input terminal units of the signal lines 4 in the same manner as above. Then, the input terminal units are connected to the output terminal units of the driver IC's 8, and the laser beam is irradiated from the glass substrate 1 side to the short-circuit unit later to disconnect the same.

The laser beam used herein is a beam of a laser diode excited laser (Nd-YAG laser) beam converged by a light converging system. The laser beams has a wavelength of 1064 nm, a cycle frequency of 1.2 kHz, and a stage travel speed of 30 mm /sec. The laser beam scans the short-circuit units 18 and cuts out the same with a trace width of 100 μm using a galvanometer.

The static electricity generated during the fabrication is dispersed within the liquid crystal display as was explained in the first embodiment. Thus, it has become possible to eliminate the dielectric breakdown in the MIM element 5 and electrostatic nonuniformity over the alignment films on the glass substrates 1 and 2, as well as the damages to or performance degradation of the driver IC's 8 and 9 and the driving circuits thereof.

The outer surface of the sealing section is spaced apart from the driver IC's 8 and 9 in the present embodiment. Therefore, no heat such that breaks the driver IC's 8 and 9 is transferred to the same.

As a result, the liquid crystal displays can be produced at enhanced yield. For instance, the possibility of any failure of the insulating film 13 in the MIM element 5 within the effective display area per panel during the fabrication shows a remarkable fall from 90% to 1% or less.

Moreover, since the short-circuit units are made on their respective glass substrates beyond the sealing section herein, the panel does not have to be upsized. In other words, the short-circuit units can be made regardless of the panel size.
(Fifth Embodiment)

Figure 11:
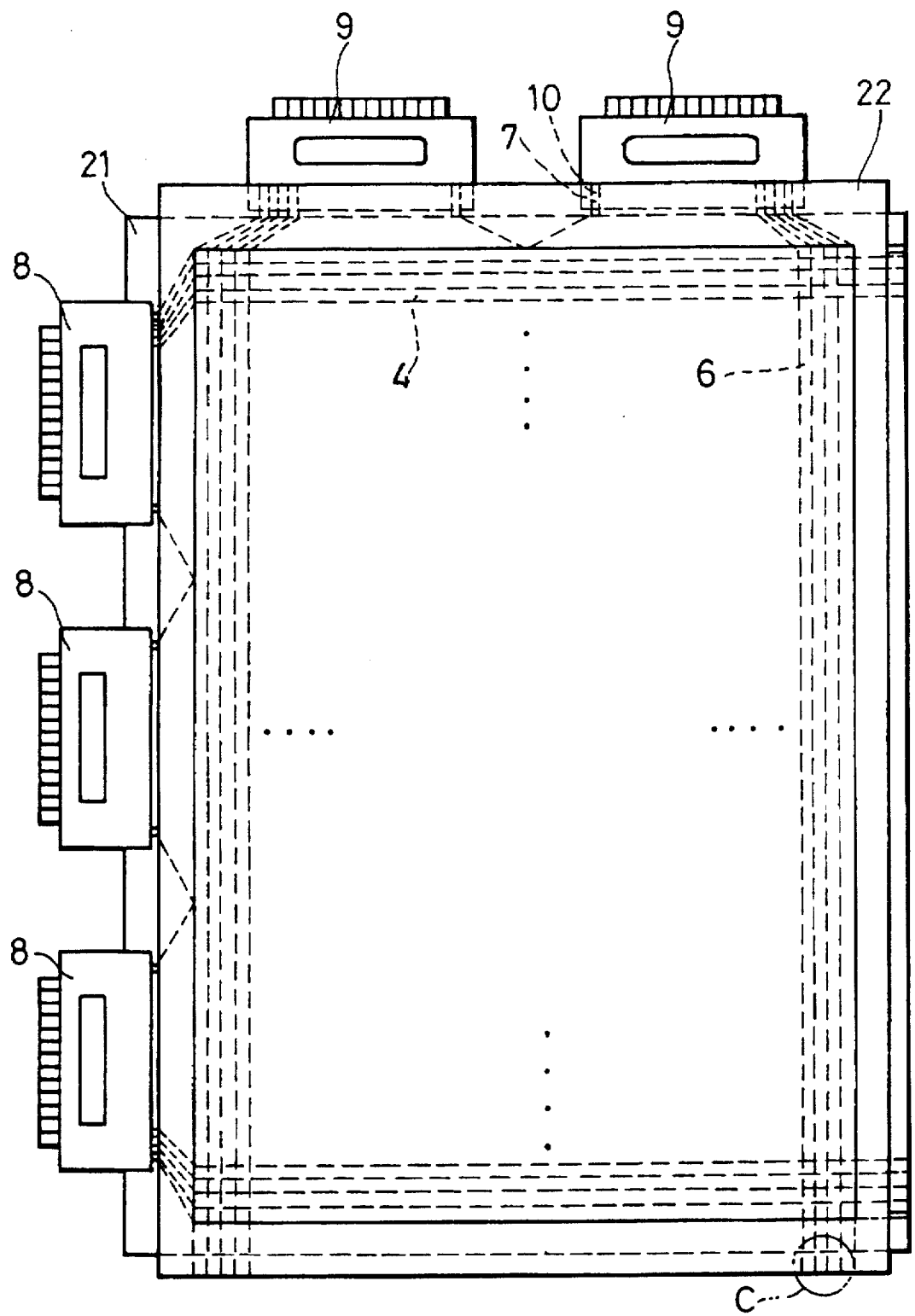
FIG. 11 is a view showing a schematic structure of a liquid crystal display in accordance with still another example embodiment of the present invention.
Figure 12:
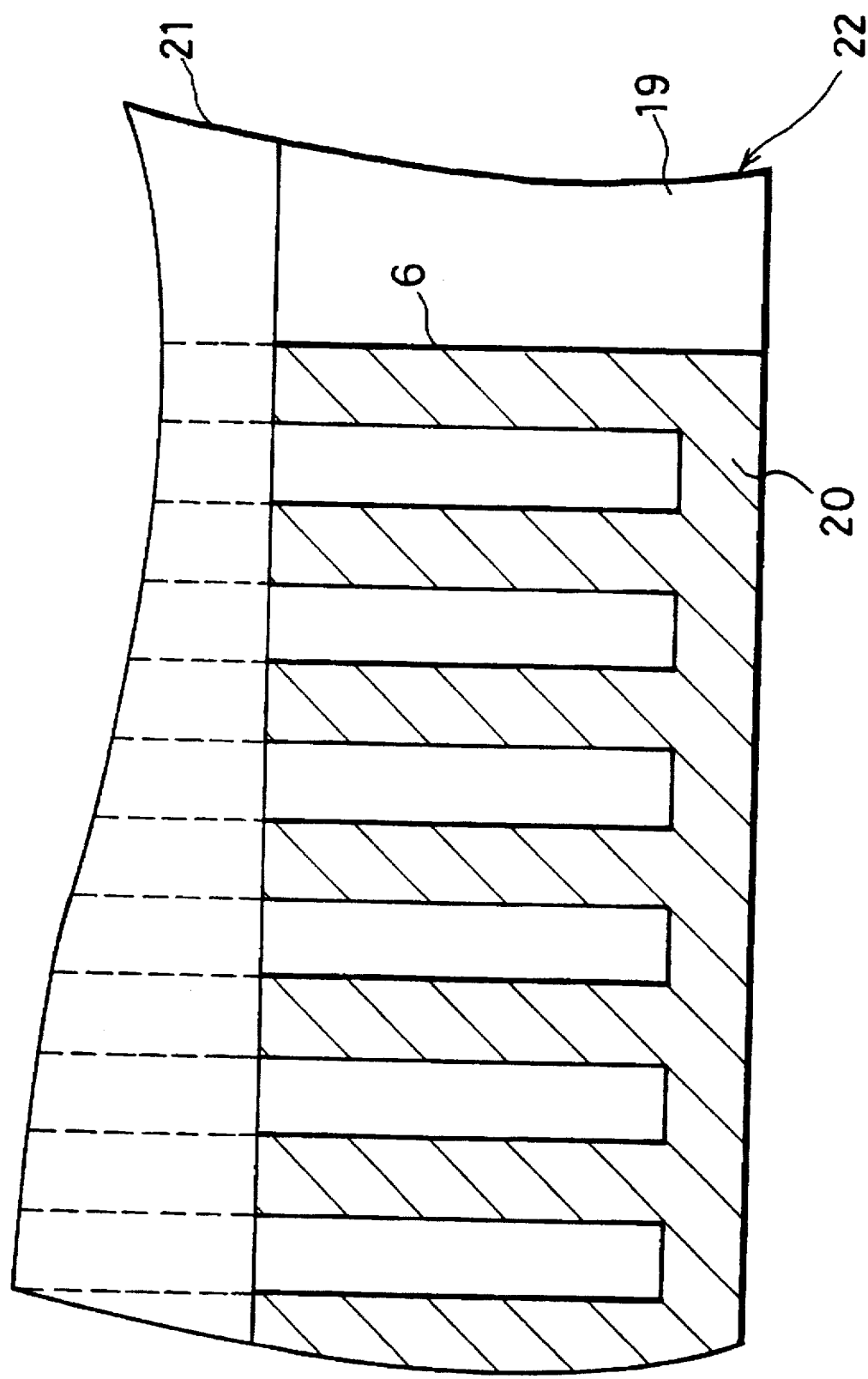
FIG. 12 is a plan view showing a dummy terminal unit formed in the above liquid crystal display.
Figure 13:
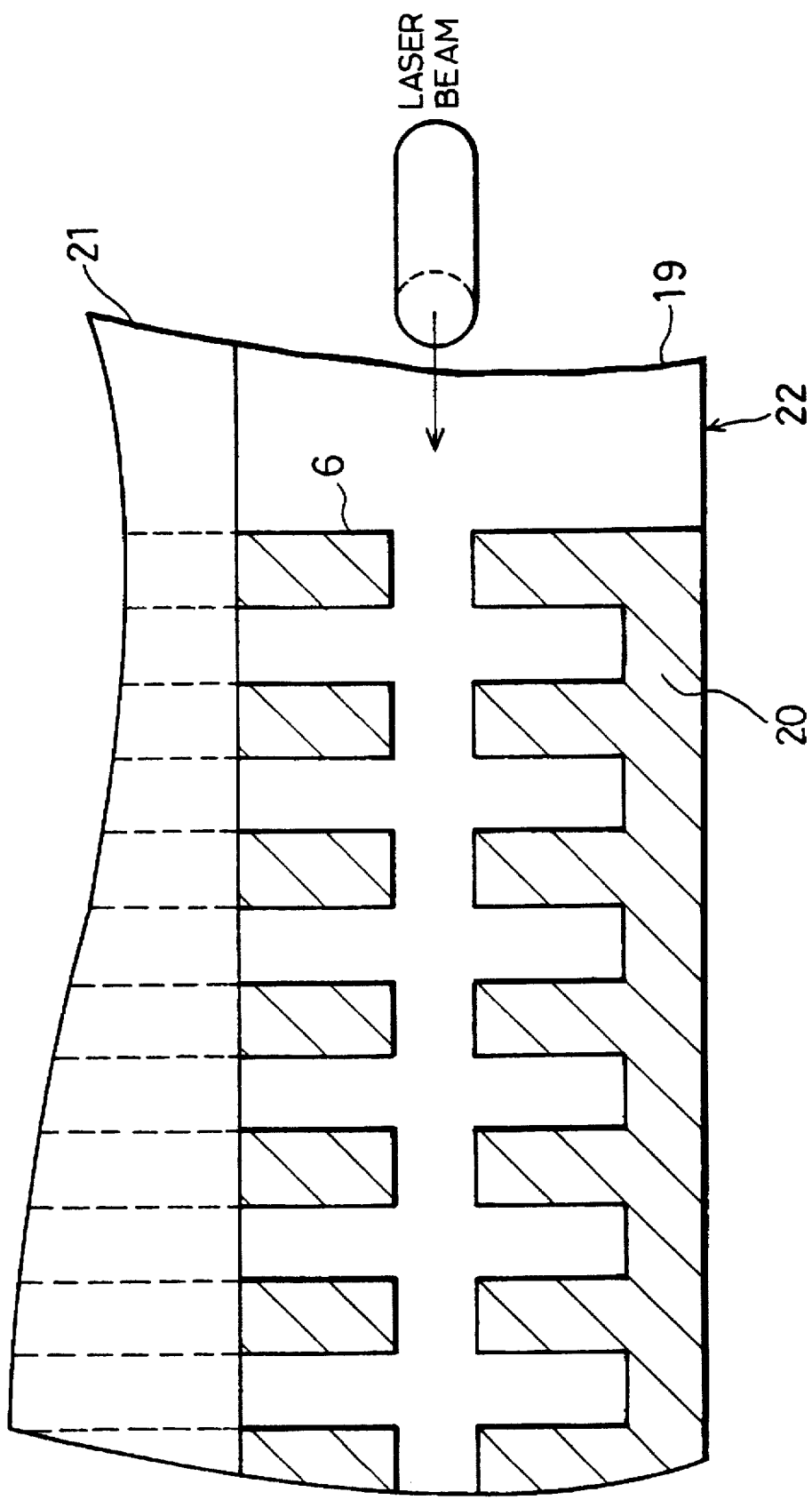
FIG. 13 is a plan view showing the above dummy terminal unit when the scanning lines provided thereon are disconnected.

Referring to FIGS. 11 through 13, the following description will describe a fifth example embodiment of the present invention. Hereinafter, like components are labeled with like reference numerals with respect to the first embodiment, and the description of these components is not repeated for the explanation's convenience.

As shown in FIG. 11, a liquid crystal display in accordance with the present embodiment includes glass substrates 21 and 22 instead of the glass substrates 1 and 2.

More precisely, as illustrated in FIG. 12 showing a magnified view of a portion indicated by a capital letter C in FIG. 11, the glass substrate 22 is longer than the other glass substrate 21 at the end opposing the input terminal units 7. A dummy terminal unit 19 is formed by extending the scanning lines 6 over the protruding end portion, and a short-circuit unit 20 is made throughout the extended scanning lines 6. FIG. 12 illustrates the liquid crystal display seen from the glass substrate 21 side.

The input terminal units 7 of the scanning lines 6 and the output terminal units 10 of the driver IC's 9 are connected to each other as shown in FIG. 11 in the same manner as the first embodiment, and later, a laser beam is irradiated to the dummy terminal unit 19 from the glass substrate 22 side in a direction perpendicular to the wiring of the scanning lines 6 across the same to disconnect the dummy terminal unit 19. FIG. 13 illustrates the disconnected dummy terminal unit 19. The laser beam used in the fourth embodiment is also used herein.

Likewise, the glass substrate 21 is longer than the other glass substrate 22 at the end opposing the input terminal units of the signal lines 4. Although it is not shown in the drawing, the signal lines 4 are extended over the protruding end portion, and a short-circuit unit is made throughout the extended signal lines 4. The short-circuit unit is disconnected later in the same manner as above.

The static electricity generated during the fabrication is dispersed within the liquid crystal display as was explained in the first embodiment. Thus, it has become possible to eliminate the dielectric breakdown in the MIM element 5 and electrostatic nonuniformity over the alignment films on the glass substrates 21 and 22, as well as the damages to or performance degradation of the driver IC's 8 and 9 and the driving circuits thereof.

The dummy terminal units are spaced apart from the driver IC's 8 and 9 in the present embodiment. Therefore, no heat such that breaks the driver IC's 8 and 9 is transferred to the same.

As a result, the liquid crystal displays can be produced at enhanced yield. For instance, the possibility of any failure of the insulating film 13 in the MIM element 5 within the effective display area per panel during the fabrication shows a remarkable fall from 90% to 1% or less.

In addition, the panel can be checked using the signal lines 4 and scanning lines 6 extended over the protrusion of the glass substrates 21 and 22, respectively.

Figure 14:
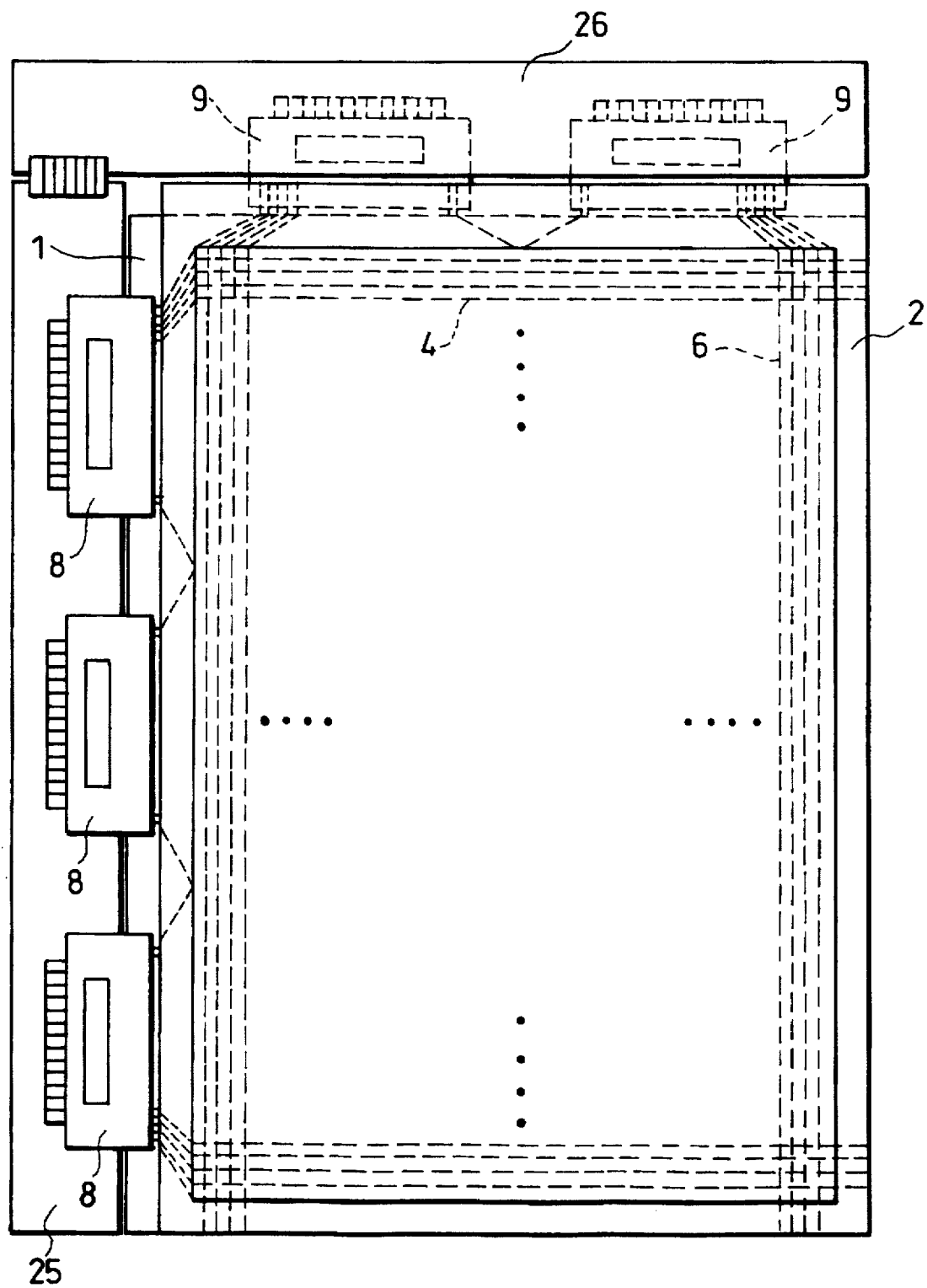
FIG. 14 is a plan view showing a schematic structure of a liquid crystal display when driver IC's are connected to their respective driving circuit substrates.

In the first through fifth embodiments, the input terminal units of the scanning lines 6 and signal lines 4 are connected respectively to the drivers IC's 9 and 8, and the short-circuit units are disconnected later. However, the disconnection timing is not limited to the above. For example, as shown in FIG. 14, the driver IC's 8 and 9 may be connected respectively to a driving circuit substrate 25 (first driving circuit substrate) and another driving circuit substrate 26 (second driving circuit substrate), and the short-circuit units may be disconnected later.

In addition, the first through fifth embodiments described the producing methods of a liquid crystal display using the MIM elements 5 as an example of the non-linear resistor elements; however, the non-linear resistors are not limited to the MIM elements 5. For further understanding, the following description will describe an example liquid crystal display using TFT elements as the non-linear resistor elements with reference to FIGS. 15 through 17. Note that like components are labeled with like reference numerals with respect to the first through fifth embodiments, and the description of these components is not repeated for the explanation's convenience.

Figure 15:
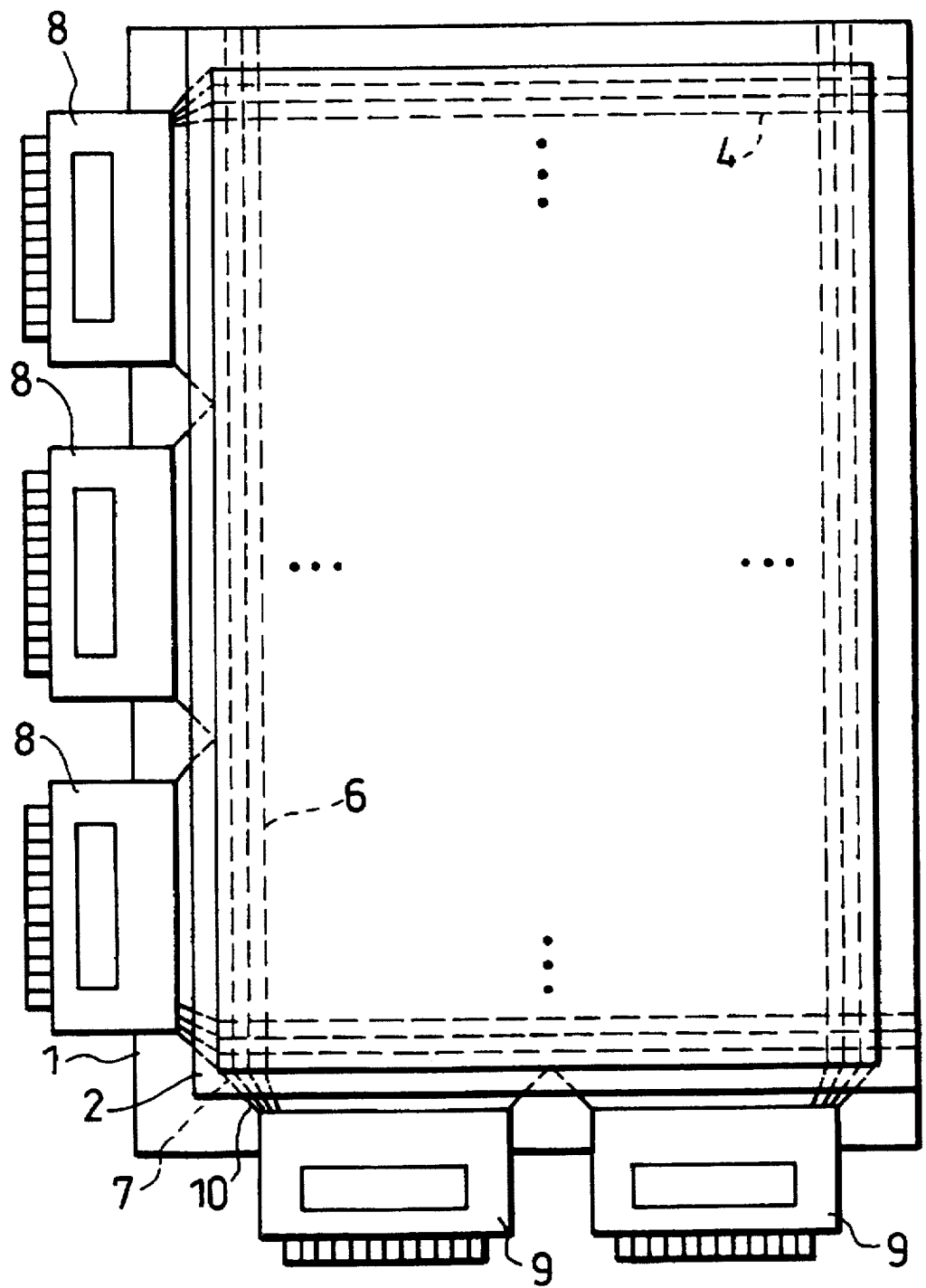
FIG. 15 is a plan view showing a schematic structure of a liquid crystal display using TFT elements.

FIG. 15 shows a schematic structure of the liquid crystal display using the TFT elements. The liquid crystal display of this type includes a glass substrate 1 (first substrate) and another glass substrate 2 (second substrate) bonded to each other with an unillustrated sealing material, and unillustrated liquid crystals are filled in the space between the two substrates. Signal lines 4 and scanning lines 6 are formed on the glass substrate 1, while unillustrated opposing electrodes are provided on the other glass substrate 2 in such a manner to oppose the signal lines 4 and scanning lines 6.

The liquid crystal display is driven by driver IC's 8 (first driving circuits) and driver IC's 9 (second driving circuits). Unillustrated output terminal units of the driver IC's 8 are connected to the side of the input terminal units side of the signal lines 4, while output terminal units 10 of the driver IC's 10 are connected to the side of the input terminal units 7 side of the scanning lines 6. Note that the above output terminal units are made of a base film (polyimide film).

Figure 16:
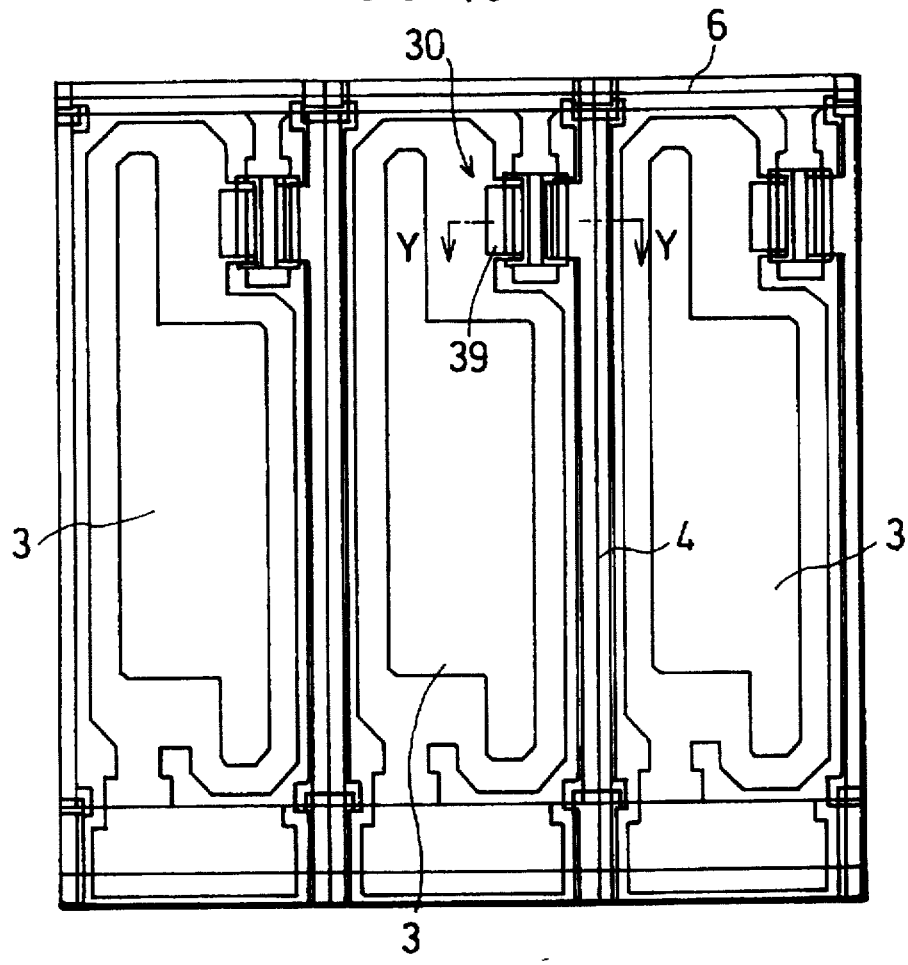
FIG. 16 is a plan view depicting a structure of a pixel formed in the above liquid crystal display.
Figure 17:
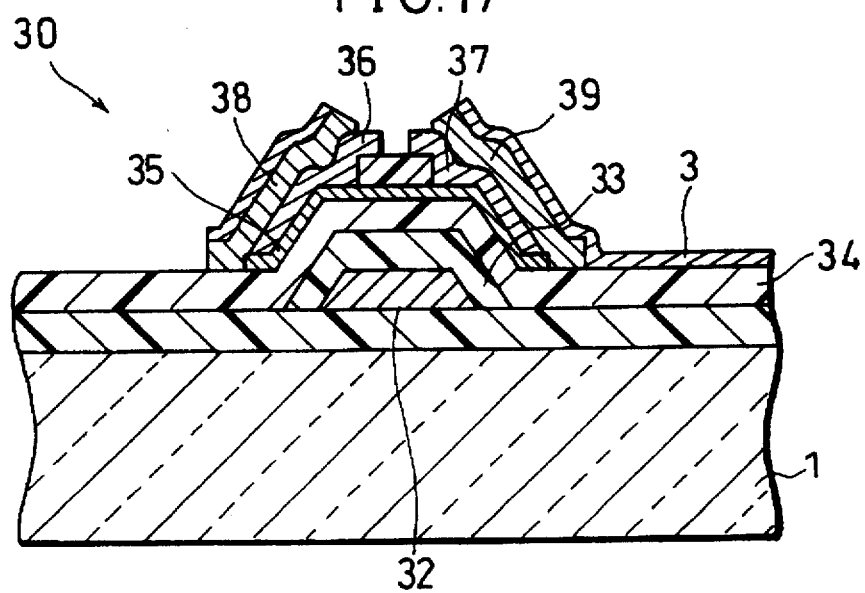
FIG. 17 is a perspective cross sectional view taken on line Y—Y of FIG. 16.
Figure 18:
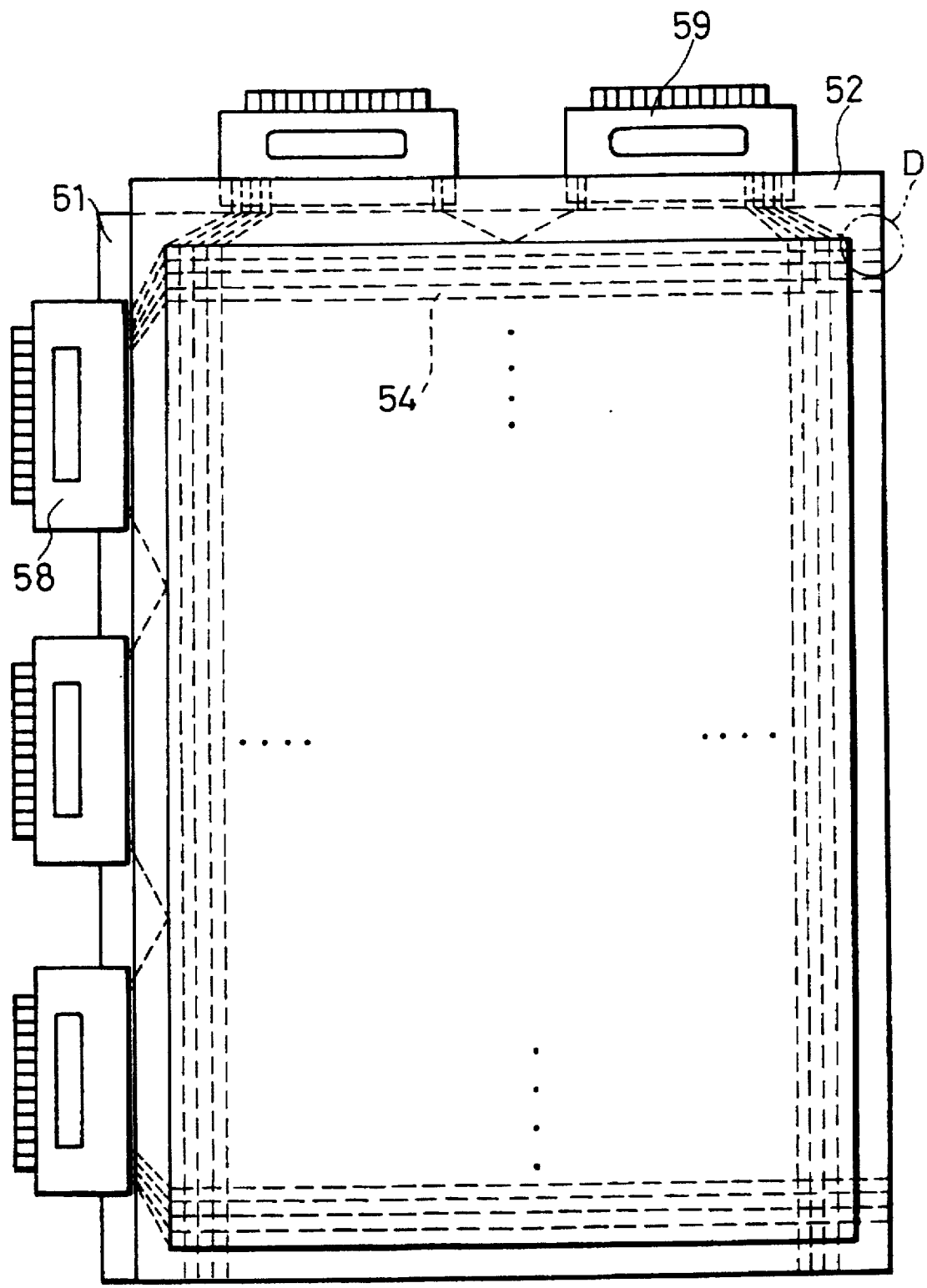
FIG. 18 is a plan view showing a schematic structure of a conventional liquid crystal display.
Figure 19:
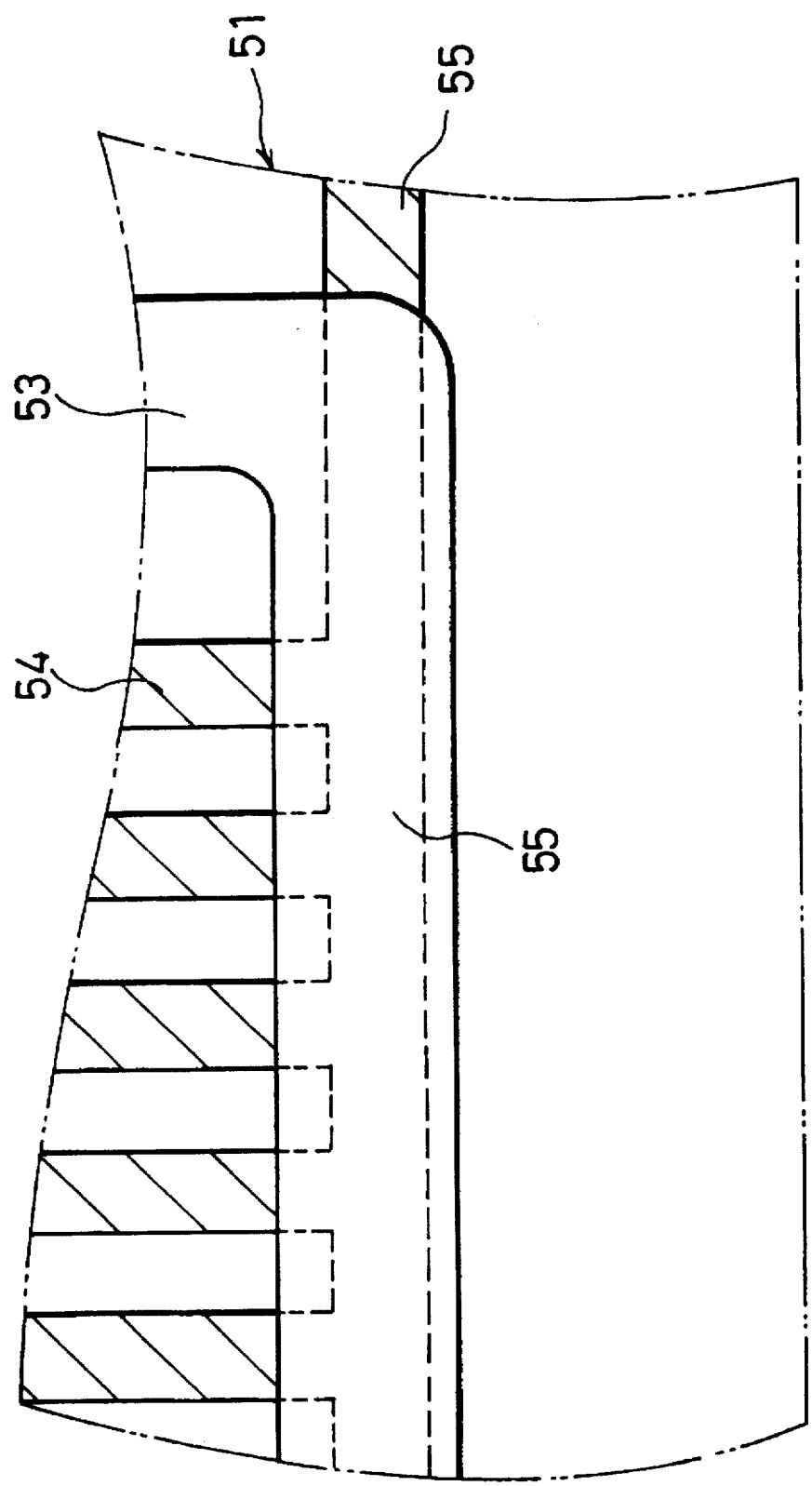
FIG. 19 is a plan view depicting a short-circuit unit made throughout the signal lines in the above conventional liquid crystal display.

As shown in FIG. 16, a matrix of pixel electrodes 3 are also formed on the glass substrate 1 and a plurality of TFT elements 30 are provided to electrically connect the signal lines 4, scanning lines 6, and pixel electrodes 3, respectively. FIG. 17 is a perspective cross sectional view taken on line Y—Y of FIG. 16.

As shown in FIG. 17, each TFT element 30 is a lamination of a gate electrode 32, a gate insulation film 33 made of tantalum oxide (TaO$_x$) or the like, an insulation film 34 made of silicon nitride (SiN$_x$) or the like, a semiconductor layer 35 made of amorphous silicon of i-type, a source contact area 36 and a drain contact area 37 both made of amorphous silicon of n+-type, and a source electrode 38 and a drain electrode 39 both made of a metal thin film, which are layered from bottom to top. The gate electrode 32 is electrically connected to the scanning line 6, and the source electrode 38 is electrically connected to the signal line 4 while the drain electrode 39 is electrically connected to the pixel electrodes, which is illustrated in FIG. 16.

The methods described in the first through fifth embodiments can be used for the above liquid crystal display using the TFT elements 30, and not only the yield of the liquid crystal displays can be enhanced dramatically, but also substantially the same effects of the first through fifth embodiments can be realized as well.

In case of TFT elements, the signal lines 4 and scanning lines 6 are formed on the single glass substrate 1. Thus, the steps of making the short-circuit units and disconnecting the same are carried out only once using one glass substrate, thereby simplifying the producing steps compared to the case using the 2-terminal non-linear resistor elements.

Moreover, the methods explained in the first through fifth embodiments can be applied to non-active-dot-matrix liquid crystal display, in which transparent segment electrodes (data signal electrodes) and a common electrode (scanning signal electrode) are formed respectively on a pair of glass substrates and the liquid crystals are filled in a space therebetween.

Further, a Nd-YAG laser beam is used in the first through fifth embodiments; however, other types of laser beams including a CO$_2$ laser beam and an excimer laser beam can be used as well.

The invention being thus described, it will be obvious that the same may be varied in many ways. Such variations are not to be regarded as a departure from the spirit and scope of the invention, and all such modification as would be obvious to one skilled in the art are intended to be included within the scope of the following claims.

What is claimed is:

1. A method of producing a liquid crystal display including (a) a first substrate having a matrix of pixel electrodes, signal lines for supplying charges to each pixel electrode, and two-terminal non-linear resistor elements for switching current conductance between said pixel electrodes and said signal lines, (b) a second substrate having scanning lines opposing said pixel electrodes, and (c) a liquid crystal filled in a sealing section between said first and second substrates, said method comprising the steps of:

(A) making electric short-circuit units throughout said signal lines and throughout scanning lines, respectively;

(B) connecting a first driving circuit to said signal lines and connecting a second driving circuit to said scanning lines; and (C) disconnecting said short-circuit units by irradiation of a light beam, said step (A) including sub-steps of:

extending two wires respectively from different points along every two adjacent signal lines in a width direction of the same, and connecting said two wires with a longitudinal wire extending along the signal lines; and extending two wires respectively from different points along every two adjacent scanning lines in a width direction of the same, and connecting said two wires with a longitudinal wire extending along the scanning lines.

2. A method of producing a liquid crystal display including (a) a first substrate having a matrix of pixel electrodes, signal lines for supplying charges to each pixel electrode, and two-terminal non-linear resistor elements for switching current conductance between said pixel electrodes and said signal lines, (b) a second substrate having scanning lines opposing said pixel electrodes, and (c) a liquid crystal filled in a sealing section between said first and second substrates, said method comprising the steps of:

making electrical short-circuit units throughout said signal lines and throughout said scanning lines, respectively;

connecting a first driving circuit to said signal lines and connecting a second driving circuit to said scanning lines; and disconnecting said short-circuit units by irradiation of a light beam, wherein said short-circuit units are made on a first connecting portion and a second connecting portion, said first connecting portion being a connection between said first driving circuit and said signal lines, said second connecting portion being a connection between said second driving circuit and said scanning lines.

3. The method of producing the liquid crystal display as defined in claim 2 further comprising the step of making through holes in an output terminal substrate of said first driving circuit at said first connecting portion and an output terminal substrate of said second driving circuit at said second connecting portion, one through hole crossing one short-circuit unit.

4. A method of producing a liquid crystal display including (a) a first substrate having a matrix of pixel electrodes, signal lines and scanning lines for supplying charges to each pixel electrode, and three-terminal non-linear resistor elements for switching current conductance through said pixel electrodes, said sisal lines, and said scanning lines, (b) a second substrate having opposing electrodes opposing said pixel electrodes individually, and (c) a liquid crystal filled in a sealing section between said first and second substrates, said method comprising the steps of:

(A) making electrical short-circuit units throughout said signal lines and througout said scanning lines, respectively:

(B) connecting a first driving circuit to said signal lines and connecting a second driving circuit to said scanning lines; and (C) disconnecting said short-circuit units by in irradition of a light beam, said step (A) including sub-steps of:

extending two wires respectively from different points along every two adjacent signal lines in a width direction of the same, and connecting said two wires with a longitudinal wire extending along the signal lines; and extending two wires respectively from different points along every two adjacent scanning lines in a width direction of the same, and connecting said two wires with a longitudinal wire extending along the scanning lines.

5. A method of producing a liquid crystal display including (a) a first substrate having a matrix of pixel electrodes, signal lines and scanning lines for supplying charges to each pixel electrode, and three-terminal non-linear resistor elements for switching current conductance through said pixel electrodes, said signal lines, and said scanning lines, (b) a second substrate having opposing electrodes opposing said pixel electrodes individually, and (c) a liquid crystal filled in a sealing section between said first and second substrates, said method comprising the steps of:

making electrical short-circuit units throughout said signal lines and throughout said scanning lines, respectively;

connecting a first driving circuit to said signal lines and connecting a second driving circuit to said scanning lines; and disconnecting said short-circuit units by irradiation of a light beam, wherein said short-circuit units are made on a first connecting portion and a second connecting portion, said first connecting portion being a connection between said first driving circuit and said signal lines, said second connecting portion being a connection between said second driving circuit and said scanning lines.

6. The method of producing the liquid crystal display as defined in claim 5 further comprising the step of making through holes in an output terminal substrate of said first driving circuit at said first connecting portion and an output terminal substrate of said second driving circuit at said second connecting portion, one through hole crossing one short-circuit unit.

7. A method of producing a liquid crystal display including a first substrate having signal lines, a second substrate having scanning lines opposing said signal lines, and a liquid crystal sealed in a sealing section between said first and second substrates, said method comprising the steps of:

(A) making electrical short-circuit units throughout said signal lines and throughout said scanning lines, respectively;

(B) connecting a first driving circuit to said signal lines and connecting a second driving circuit to said scanning lines; and (C) disconnecting said short-circuit units by irradiation of a light beam, said step (A) including sub-steps of:

extending two wires respectively from different points along every two adjacent signal lines in a width direction of the same, and connecting said two wires with a longitudinal wire extending along the signal lines; and extending two wires respectively from different points along every two adjacent scanning lines in a width direction of the same, and connecting said two wires with a longitudinal wire extending along the scanning lines.

8. A method of producing a liquid crystal display including a first substrate having signal lines, a second substrate having scanning lines opposing said signal lines, and a liquid crystal sealed in a sealing section between said first and second substrates, said method comprising the steps of:

making electrical short-circuit units throughout said signal lines and throughout said scanning lines respectively;

connecting a first driving circuit to said signal lines and connecting a second driving circuit to said scanning lines; and disconnecting said short-circuit units by irradiation of a light beam, wherein said short-circuit units are made on a first connecting portion and a second connecting portion, said first connecting portion being a connection between said first driving circuit and said signal lines, said second connecting portion being a connection between said second driving circuit and said scanning lines.

9. The method of producing the liquid crystal display as defined in claim 8 further comprising the step of making through holes in an output terminal substrate of said first driving circuit at said first connecting portion and an output terminal substrate of said second driving circuit at said second connecting portion, one through hole crossing one short-circuit unit.

10. A method of producing a liquid crystal display including (a) a first substrate having a matrix of pixel electrodes, signal lines for supplying charges to each pixel electrode, and 2-terminal non-linear resistor elements for switching current conductance between said pixel electrodes and said signal lines, (b) a second substrate having scanning lines opposing said pixel electrodes, and (c) liquid crystal filled in a sealing section between said first and second substrates, said method comprising the steps of:

extending said signal lines on said first substrate over an end portion opposing a first connecting portion where said signal lines are to be connected to a first driving circuit, said end portion being longer than a corresponding end portion of said second substrate;

extending said scanning lines on said second substrate over an end portion opposing a second connecting portion where said scanning lines are to be connected to a second driving circuit, said end portion being longer than a corresponding end portion of said first substrate;

making short-circuit units throughout said signal lines and throughout said scanning lines on said end portions of said first and second substrate, respectively;

connecting said signal lines and said scanning lines to said first driving circuit and said second driving circuit, respectively; and disconnecting said first and second short-circuit units by irradiation of a light beam.

11. A method of producing a liquid crystal display including (a) a first substrate having a matrix of pixel electrodes, signal lines and scanning lines for supplying charges to each pixel electrode, and 3-terminal non-linear resistor elements for switching current conductance through said pixel electrodes, said signal lines, and scanning lines (b) a second substrate having opposing electrodes opposing said pixel electrodes individually, and (c) liquid crystal filled in a sealing section between said first and second substrates, said method comprising the steps of:

extending said signal lines on said first substrate over an end portion opposing a first connecting portion where said signal lines are to be connected to a first driving circuit, said end portion being longer than a corresponding end portion of said second substrate;

extending said scanning lines on said first substrate over an end portion opposing a second connecting portion where said scanning lines are to be connected to a second driving circuit, said end portion being longer than a corresponding end portion of said second substrate;

making short-circuit units throughout said signal lines and throughout said scanning lines on said end portions of said first and second substrate, respectively;

connecting said signal lines and said scanning lines to said first driving circuit and said second driving circuit, respectively; and disconnecting said first and second short-circuit units by irradiation of a light beam.

12. A method of producing a liquid crystal display including a first substrate having signal lines, a second substrate having scanning lines opposing said signal lines, and liquid crystal sealed in a sealing section between said first and second substrates, said method comprising the steps of:

extending said signal lines on said first substrate over an end portion opposing a first connecting portion where said signal lines are to be connected to a first driving circuit, said end portion being longer than a corresponding end portion of said second substrate;

extending said scanning lines on said second substrate over an end portion opposing a second connecting portion where said scanning lines are to be connected to a second driving circuit, said end portion being longer than a corresponding end portion of said first substrate;

making short-circuit units throughout said signal lines and throughout said scanning lines on said end portions of said first and second substrate, respectively;

connecting said signal lines and said scanning lines to said first driving circuit and said second driving circuit, respectively; and disconnecting said first and second short-circuit units by irradiation of a light beam.

\* \* \* \* \*

UNITED STATES PATENT AND TRADEMARK OFFICE
CERTIFICATE OF CORRECTION

PATENT NO. : 5,731,854
DATED : March 24, 1998
INVENTOR(S) : Masahiro Kishida

It is certified that error appears in the above-identified patent and that said Letters Patent is hereby corrected as shown below:

On the cover page, item [75], please change "Nabara" to -- NABARI --.

Signed and Sealed this

Eighth Day of September, 1998

Attest:

BRUCE LEHMAN

Attesting Officer          Commissioner of Patents and Trademarks